US012777769B2

(12) United States Patent
Kaviani et al.

(10) Patent No.: US 12,777,769 B2
(45) Date of Patent: Oct. 27, 2026

(54) METHODS AND APPARATUS UTILIZING CONJUGATED POLYMERS IN INTEGRATED CIRCUIT PACKAGES WITH GLASS SUBSTRATES

(71) Applicant: Intel Corporation, Santa Clara, CA (US)

(72) Inventors: Shayan Kaviani, Phoenix, AZ (US); Benjamin Duong, Phoenix, AZ (US); Miranda Ngan, Chandler, AZ (US); Mahdi Mohammadighaleni, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 827 days.

(21) Appl. No.: 17/954,917

(22) Filed: Sep. 28, 2022

(65) Prior Publication Data

US 2024/0107784 A1 Mar. 28, 2024

(51) Int. Cl.
*H10K 30/88* (2023.01)

(52) U.S. Cl.
CPC .................................... *H10K 30/88* (2023.02)

(58) Field of Classification Search
CPC ...... H10K 30/88; H10K 71/12; H10K 85/111; H10K 85/151; H10K 85/113; H10K 19/901; G02F 1/163
See application file for complete search history.

(56) References Cited

U.S. PATENT DOCUMENTS

| | | | | |
|---|---|---|---|---|
| 2005/0077615 A1* | 4/2005 | Yu | H01L 23/367 257/E23.102 |
| 2008/0297029 A1* | 12/2008 | Cok | H10K 50/11 313/498 |
| 2011/0257294 A1* | 10/2011 | Cardinali | C08K 5/0033 523/124 |
| 2022/0376181 A1* | 11/2022 | Chang | C08L 65/00 |
| 2024/0196638 A1* | 6/2024 | Wang | H10K 71/30 |
| 2024/0341118 A1* | 10/2024 | Namin | G06N 5/01 |

OTHER PUBLICATIONS

Steckler et al., "Very Low Band Gap Thiadiazoloquinoxaline Donor-Acceptor Polymers as Multi-tool Conjugated Polymers," Journal of the American Chemical Society, Mar. 15, 2022, 4 Pages.
Luo et al., "Acrylate-Substituted Thiadiazoloquinoxaline Yields Ultralow BandGap (0.56 eV) Conjugated Polymers for Efficient Photoacoustic Imaging", Aug. 11, 2021, 7 Pages.
Yao et al., "Near-IR Electrochromism in Electropolymerized Films of a Biscyclometalated Ruthenium Complex Bridged by 1,2,4,5-Tetra(2-pyridyl)benzene", Journal of the American Chemical Society, Dec. 1, 2011, 4 Pages.

* cited by examiner

*Primary Examiner* — S M Sohel Imtiaz
(74) *Attorney, Agent, or Firm* — Hanley, Flight & Zimmerman, LLC

(57) ABSTRACT

Methods, apparatus, systems, and articles of manufacture utilizing conjugated polymers in integrated circuit packages with glass substrates are disclosed. A disclosed integrated circuit (IC) package includes: a glass substrate; a first electrode; an organic material; and a second electrode. The first electrode is between the glass substrate and the organic material. The organic material includes at least one of a conjugated polymer or a metal-organic supramolecule. The organic material is between the first electrode and the second electrode.

16 Claims, 13 Drawing Sheets

METHODS AND APPARATUS UTILIZING CONJUGATED POLYMERS IN INTEGRATED CIRCUIT PACKAGES WITH GLASS SUBSTRATES

FIELD OF THE DISCLOSURE

This disclosure relates generally to integrated circuit packages and, more particularly, to methods and apparatus utilizing conjugated polymers in integrated circuit packages with glass substrates.

BACKGROUND

Integrated circuit (IC) chips and/or semiconductor dies are routinely connected to larger circuit boards such as motherboards and other types of printed circuit boards (PCBs) via a package substrate. Integrated circuit (IC) chips and/or dies have exhibited reductions in size and increases in interconnect densities as technology has advanced.

Figure 1:
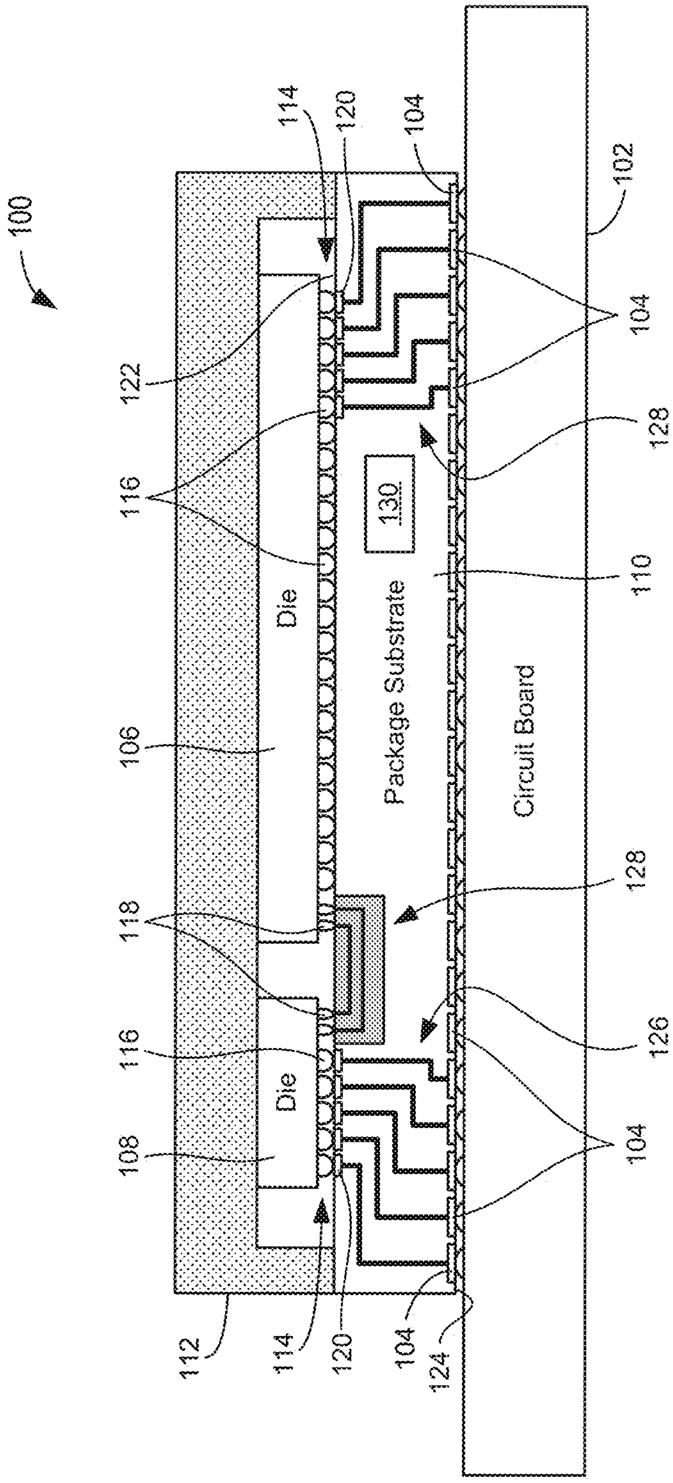
FIG. 1 illustrates an example integrated circuit (IC) package on a printed circuit board.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, one or more ASICs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

Many known photodetectors (e.g., photodiodes) used in integrated circuit packages are fabricated on semiconductor (e.g., silicon) wafers. The materials and processes involved to manufacture such silicon-based photodetectors is relatively expensive. Further, photodetectors manufactured from silicon wafers are mechanically inflexible and, therefore, are liable to break or otherwise fail when exposed to mechanical stress, strain, or shock. As an alternative to silicon-based photodetectors, germanium-based materials may also be used. However, germanium-based materials and the associated processing is at least as expensive as silicon and associated silicon wafer processing. Furthermore, germanium-based materials also suffer from a lack of mechanical flexibility and, therefore, may break when subjected to stress such as shear forces or impact loads.

Rather than relying on silicon or germanium-based materials, examples disclosed herein use conjugated materials in photodetectors and/or photonic-based components (e.g., filters). A conjugated material is defined herein to be a material that includes molecules exhibiting alternating single and double bonds of elements in the molecule. Conjugated materials may be made of abundant and inexpensive elements, thereby reducing costs relative to silicon or germanium-based photonic devices. In addition, conjugated materials are easier to process than silicon or germanium-based materials, thereby providing for reduced manufacturing costs. In particular, conjugated materials are processible via both wet and dry approaches. Further, many organic conjugated materials are easier to etch with typical organic solvents, and via dry etch processes. This makes the patterning of conjugated materials easier than silicon or germanium-based materials. Further, processing operations for conjugated materials are suitable for use with substrates made of glass, which are beneficial in photonic devices.

Conjugated materials used in examples disclosed herein include conjugated polymers and/or metal-organic supramolecules and polymers. In some examples, the conjugated polymers are π-conjugated organic molecules or polymers with alternating single and double bonds (C═C). The delocalized π electrons create a halo of electronic density above and beyond the molecular plane, which provide pathways for electrons to move alongside the material. Thus, such conjugated polymers are sometimes also referred to as conductive polymers because they can conduct electricity.

Many conjugated materials possess photoactive properties that enable the materials to change in electrical conductance in response to electromagnetic radiation (e.g., visible light, infrared light, etc.). As a result, such photoactive materials are suitable for implementation in a photodetector (e.g., photodiode). Furthermore, many conjugated materials possess electrochromic properties that enable the material to change in opacity (e.g., optical transmittance) in response to an applied voltage. As a result, the photonic absorption and/or transmittance of the material can be electrically controlled, thereby making such materials suitable for implementation as a filter material in photonic packages.

FIG. 1 illustrates an example integrated circuit (IC) package (e.g., a semiconductor package) 100 constructed in accordance with teachings disclosed herein. In the illustrated example, the IC package 100 is electrically coupled to a circuit board 102 via an array of contact pads or lands 104 on a mounting surface (e.g., a bottom surface) of the package. In some examples, the IC package 100 may include balls, pins, and/or pads, in addition to or instead of the contact pads 104, to enable the electrical coupling of the package 100 to the circuit board 102. In this example, the package 100 includes two semiconductor (e.g., silicon) dies 106, 108 (sometimes also referred to as chips or chiplets) that are mounted to a package substrate 110 and enclosed by a package lid or mold compound 112. While the example IC package 100 of FIG. 1 includes two dies 106, 108, in other examples, the package 100 may have only one die or more than two dies. In some examples, one of the dies 106, 108 (or a separate die) is embedded in the package substrate 110. The dies 106, 108 can provide any suitable type of functionality (e.g., data processing, memory storage, etc.).

In the illustrated example, each of the dies 106, 108 is electrically and mechanically coupled to the substrate 110 via corresponding arrays of interconnects 114. In FIG. 1, the interconnects are shown as bumps. However, the interconnects 114 may be any other type of electrical connection in addition to or instead of the bumps shown (e.g., balls, pins, pads, wire bonding, etc.). The electrical connections between the dies 106, 108 and the substrate 110 (e.g., the interconnects 114) are sometimes referred to as first level interconnects. By contrast, the electrical connections between the IC package 100 and the circuit board 102 (e.g., the pads 104) are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer. Thus, as used herein, first level interconnects refer to interconnects (e.g., balls, bumps, pins, pads, wire bonding, etc.) between a die and a package substrate or a die and an underlying die and/or interposer.

As shown in FIG. 1, the interconnects 114 of the first level interconnects include two different types of bumps, namely, core bumps 116 and bridge bumps 118. As used herein, core bumps are bumps on dies through which electrical signals pass between the dies and other components either within an IC package containing the dies (e.g., a different die) or external to the IC package. Thus, as shown in the illustrated example, when the dies 106, 108 are mounted to the package substrate 110, the core bumps 116 are physically connected and electrically coupled to contact pads 120 on an inner surface 122 of the substrate 110. The contact pads 120 on the inner surface 122 of the package substrate 110 are electrically coupled to the landing pads 104 on the bottom (external) surface 124 of the substrate 110 (e.g., a surface opposite the inner surface 122) via internal interconnects 126 within the substrate 110. As a result, there is a complete signal path between the bumps 116 of the dies 106, 108 and the landing pads 104 mounted to the circuit board 102 that pass through the contact pads 120 and the interconnects 126 provided therebetween.

As used herein, bridge bumps are bumps on the dies through which electrical signals pass between different ones of the dies within n IC package. More particularly, bridge bumps differ from core bumps in that bridge bumps electrically connect two or more different dies via an interconnect bridge embedded (e.g., the interconnect bridge 128 of FIG. 1) embedded in an underlying substrate (e.g., the package substrate 110). As represented in FIG. 1, core bumps 116 are typically larger than bridge bumps 118. In some examples, the interconnect bridge 128 and the associated bridge bumps 118 are omitted.

The example IC package 100 of FIG. 1 is a photonic package that includes at least one optical component 130 integrated with and/or carried by the substrate 110. More particularly, in some examples, the substrate 110 includes a glass substrate, layer, or core 202 (shown in FIG. 2) to which the optical component 130 is coupled. In some examples, light is directed through and/or along the glass core 202 toward the optical component 130. In some examples, the optical component 130 is distinct from the dies 106, 108 coupled to and/or carried by the substrate 110. In some such examples, at least one of the dies 106, 108 is a photonic integrated circuit (PIC) that is optically coupled to the optical component 130 supported by the substrate 110. Additionally or alternatively, at least one of the dies 106, 108 may be electrically coupled to electrodes of the optical component 130. An example implementation of the optical component 130 is the photodetector detailed further below in connection with FIG. 3. Another example implementation of the optical component 130 is the photonic filter detailed further below in connection with FIG. 4.

Figure 2:
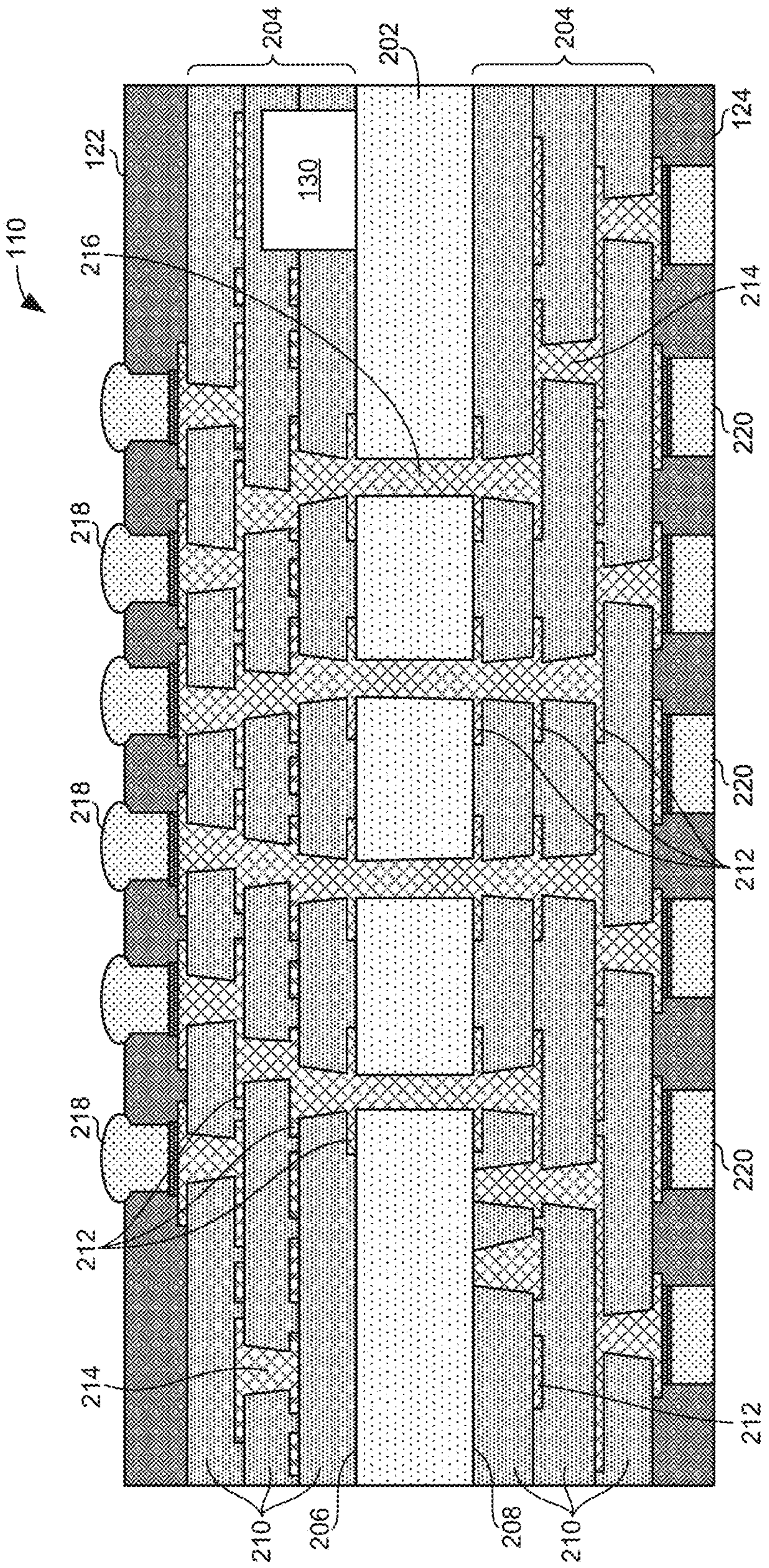
FIG. 2 is a cross-sectional view of an example package substrate that may be implemented in the IC package of FIG. 1.

FIG. 2 is a cross-sectional view providing further detail for an example implementation of the example package substrate 110 of FIG. 1. The package substrate 110 of the illustrated example includes a glass substrate or core 202 between two separate build-up layers or regions 204. In this example, the build-up regions 204 are provided on a first surface 206 of the glass core 202 and a second surface 208 of the glass core 202 opposite the first surface 206. The build-up regions 204 of the illustrated example are defined by an alternating pattern of insulation of dielectric layers 210 and patterned conductive (e.g., metal) layers 212. In this example, there are three dielectric layers 210 and three conductive layers 212 in the build-up regions 204 (not including the outermost layer of conductive material). However, in other examples, any other suitable number of dielectric and conductive layers 210, 212 may be employed. In some examples, the build-up region 204 on at least one side of the glass core 202 may be omitted such that the glass core defines an exterior surface of the package substrate 110.

The conductive layers 212 in the build-up regions 204 are patterned to define electrical routing or conductive traces that serve as signaling or transmission lines to transfer power and/or signals of information between two or more components (e.g., transistors, capacitors, resistors, backend layers, etc. and/or other circuitry) of an associated IC package (e.g., the IC package 100 of FIG. 1). Electrically conductive (e.g., metal) vias 214 extend through the dielectric layers 210 to electrically coupled different ones of the conductive layers 212 in the different build-up regions 204. Further, as shown in FIG. 2, the glass core 202 of the illustrated example includes one or more of through glass vias (TGVs) 216 (e.g., copper plated vias) that extend between the opposite surfaces 206, 208 of the glass core 202 to communicatively and/or electrically couple the conductive layers 212 and associated metal vias 214 within the build-up regions 204 on either side of the glass core 202. Thus, in this examples, the electrical routing or traces defined by the patterning of the conductive layers 212, the conductive vias 214, and the TGVs 216 collectively define electrical interconnects (e.g., the interconnects 126 of FIG. 1) through the substrate 110.

In the illustrated example, the package substrate 110 includes a first plurality of connectors 218 (e.g., solder balls, bumps, contact pads, pins, etc.) on the inner surface 122 of the substrate 110 to electrically couple the package substrate 110 to one or more semiconductor die (e.g., one of the dies 106, 108 of FIG. 1) and/or any other suitable component (e.g., an interposer). Further, the example package substrate 110 includes a second plurality of solder connectors 220 (e.g., solder balls, bumps, contact pads, pins, etc.) to electrically couple the package substrate 110 to a printed circuit board (e.g., the circuit board 102 of FIG. 1), an interposer and/or any other substrate(s).

Although the glass core 202 of the example package substrate 110 is shown as a central core of the substrate 110, in some examples, the glass core 202 can be an interposer and/or any other layer of the package substrate 110. For example, the glass core 202 can be used in place of one or more of the dielectric layers 210 of the package substrate 110. In some examples, the package substrate 110 can include different material(s) including organic materials, silicon, and/or other conventional materials for fabricating package substrates. In some examples, the package substrate 110 includes an embedded multi-die interconnect bridge (EMIB) (e.g., the bridge 128 of FIG. 1).

High density substrate packaging techniques often use organic cores (e.g., epoxy-based prepreg layer with glass cloth) as a starting material in next-generation compute applications. These next-generation compute applications have an increased demand in scaling, which along with the proliferation of multichip architectures, specifies (e.g., dictates, requires, etc.) a reduction in warpage and thickness variation. As a result, the starting organic core material has become increasingly thicker in subsequent generation(s) to provide an effective lower coefficient of thermal expansion (CTE). The thicker starting organic core material bridges the gap (e.g., the difference, the delta) to the CTE of the silicon dies (e.g., the dies 106, 108 of FIG. 1) mounted on such substrates. However, increasing core thickness is not a universal solution, because some applications have a total core thickness restricted by customer demands (e.g., portable machines, mobile devices, etc.). In addition, the increased core thickness may be detrimental to the electrical performance of the product.

Using glass as a starting core material (e.g., the glass core 202 of FIG. 2) has a mechanical benefit, an electrical benefit, and a design flexibility benefit over using traditional organic core materials (e.g., epoxy-based prepreg). Furthermore, glass cores can be used as waveguides to define optical signal paths capable of transmitting light. As a result, it is possible to incorporate or integrate optical components directly into a package substrate adjacent a surface of the glass core. More particularly, in the illustrated example, of FIG. 2, the optical component 130 is on the first surface 206 of the glass core 202. In other examples, the optical component 130 may be on the second surface 208 of the glass core 202. In other examples, the optical component 130 may embedded within a cavity in the glass core 202. In the illustrated example, the optical component 130 has a height or thickness that is greater than one dielectric layer 210 but less than the thickness of two dielectric layers 210. However, in other examples, the optical component 130 can be larger or smaller than shown (e.g., equal to or less than the thickness of one dielectric layer 210, equal to or greater than two dielectric layers 210, etc.). Example constructions of optical components within substrate containing a glass core are further detailed in FIGS. 3 and 4.

Figure 3:
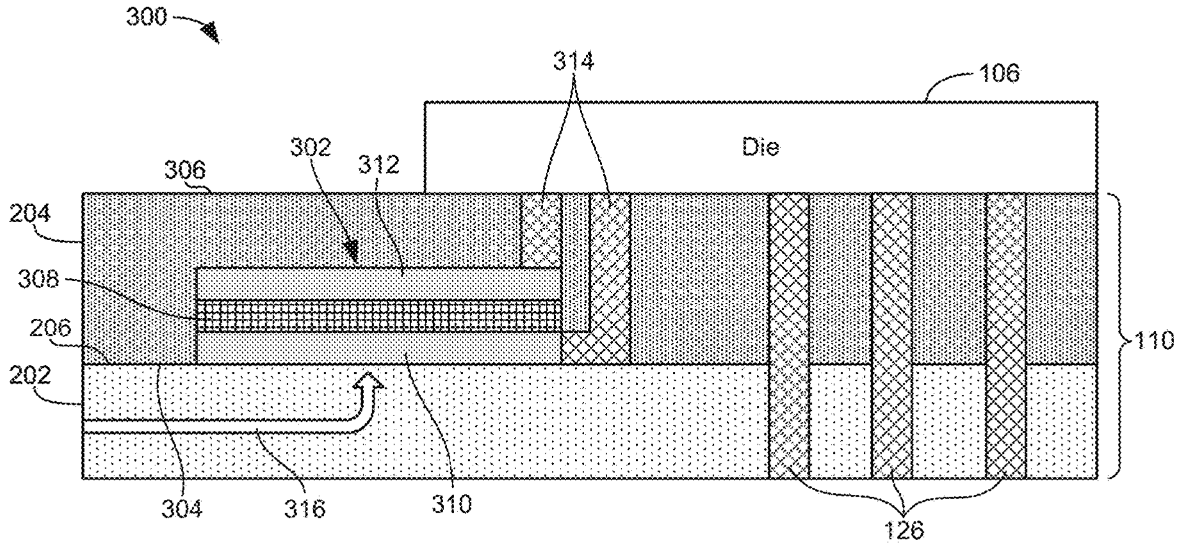
FIG. 3 is a cross-sectional view of an example IC package with an example photodetector adjacent a glass substrate.

FIG. 3 illustrates an example IC package 300 constructed in accordance with teachings disclosed herein. The example IC package 300 of FIG. 3 is an example implementation of the IC package 100 of FIG. 1. Accordingly, the same reference numbers used in FIGS. 1 and 2 are used for similar components in FIG. 3. Thus, the example IC package 300 of FIG. 3 includes a package substrate 110 supporting a semiconductor die 106. For purposes of explanation and clarity, certain aspects and/or features of the IC package 100 shown in FIGS. 1 and 2 have been simplified and/or omitted in FIG. 3. For instance, in FIG. 3, the interconnects 126 electrically coupled to the semiconductor die 106 are shown as straight columns instead of an arrangement of conductive vias 214 connected by metal traces in different conductive layers 212 within the build-up region 204 as described above in connection with FIG. 2. Despite these simplifications in FIG. 3, any of the features shown and/or described in connection with FIGS. 1 and 2 can apply to the example IC package 300 of FIG. 3.

As shown in FIG. 3, the package substrate 110 includes a glass substrate or core 202 upon which is provided a build-up region 204. In some examples, a second build-up region can be provided on the opposite side of the glass core 202. In this example, an optical component 302 is embedded within the build-up region 204. In some examples the optical component 302 of FIG. 3 corresponds to the optical component 130 of FIGS. 1 and 2. In the illustrated example, the optical component 302 is adjacent the first surface 206 of the glass core 202. The build-up region is also adjacent the first surface 206 of the glass core 202 such that the build-up region 204 surrounds the optical component 302 in a plane of ones of the dielectric layers 210 shown in FIG. 2 but omitted in FIG. 3 for purposes of clarity. Further, in some examples, the build-up region has a thickness (between first and second sides 304, 306 of the build-up region 204) that is greater than a thickness of the optical component 302. As a result, in some examples, the build-up region 204 extends over the optical component 302.

In this example, the optical component 302 is a photodetector (e.g., a photodiode) that includes an organic material 308 sandwiched between first and second electrodes 310, 312. More particularly, as shown in the illustrated example, the first electrode 310 is adjacent the glass core 202 and between the glass core 202 and the organic material 308, with the second electrode farthest from the glass core 202 on the opposite side of the organic material 308. However, due to the overall thickness of the optical component 302 being less than the thickness of the build-up region 204, the second electrode 312 is closer to the glass core 202 than the first side of the build-up region 204 is to the glass core 202. In some examples, the first electrode 310 is in direct contact with the glass core 202. In other examples, an adhesive, a metal seed layer, and/or another intermediate layer of material may be disposed between the first electrode 310 and the glass core 202.

In this example, the electrodes 310, 312 are electrically coupled to the semiconductor die 106 via corresponding interconnects 314 extending through the build-up region 204. As discussed above, the interconnects 314 are shown in a simplified form in FIG. 3 for purposes of illustration but may be defined by any suitable arrangement of conductive vias 214 and associated metal traces as described above in connection with FIG. 2.

In some examples, the electrodes 310, 312 are made from layers of metal which may be the same as or different than the metal used for the interconnects 126. In some examples, the electrodes have approximately the same thickness as the metal of the conductive layers 212 described above in FIG. 2 to facilitate electrically coupling of the electrodes to the traces and other conductive elements within the build-up region 204. Similarly, in some examples, the organic material 308 has approximately the same thickness as a single dielectric layer 210 in the build-up region 204. In some examples, the electrodes are integrally formed with and are extensions of corresponding conductive layers 212 described above in FIG. 2. In other examples, the electrodes 310, 312 may be fabricated in separate processes and/or have different thicknesses than the conductive layers 212. Likewise, in some examples, the organic material 308 can have a different thickness than the individual dielectric layers 210.

In the illustrated example of FIG. 3, the glass core 202 includes and/or defines a waveguide 316 through which light is directed along an optical path towards the optical component 302. More particularly, in some examples, the waveguide 316 is embedded in the glass core 202 using any suitable fabrication process (e.g., ion exchange, laser direct lining, etc.). The waveguide 316 directs light toward the organic material 308, which in this case has a photoactive property that results in a change in the electrical conductivity of the organic material 308 in response to the light. In this manner, the optical component 302 is able to operate as a photodetector or photodiode. In some examples, the light is able to pass through the first electrode 310 to reach the organic material 308 because the first electrode 310 is composed of a transparent material. Additionally or alternatively, in some examples, the light is able to pass through the first electrode 310 to reach the organic material 308 because the first electrode 310 includes openings extending therethrough.

Figure 4:
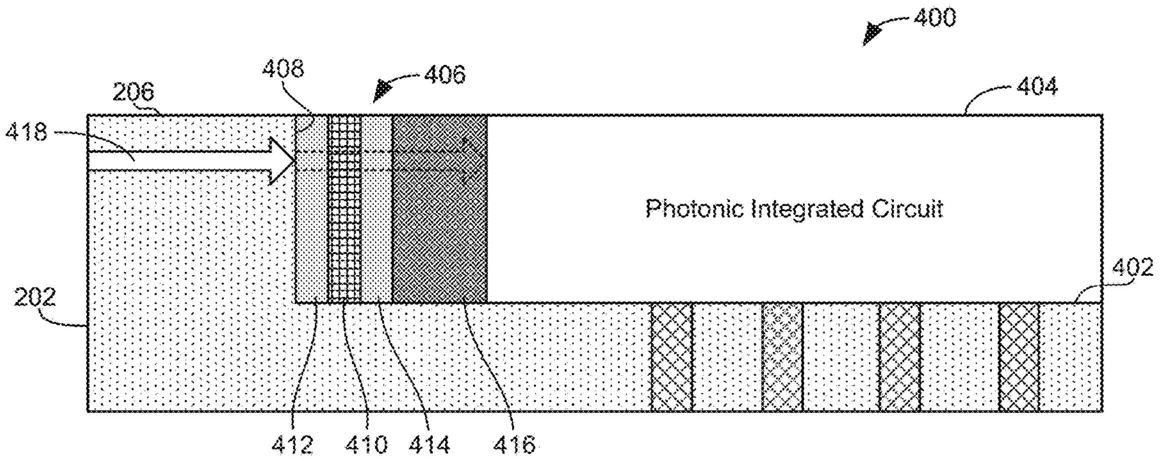
FIG. 4 is a cross-sectional view of an example IC package with an example photonic filter adjacent a glass substrate.

FIG. 4 illustrates an example IC package 400 constructed in accordance with teachings disclosed herein. The example IC package 400 of FIG. 4 is another example implementation of the IC package 100 of FIG. 1. Accordingly, the same reference numbers used in FIGS. 1 and 2 are used for similar components in FIG. 4. For purposes of explanation and clarity, certain aspects and/or features of the IC package 100 shown in FIGS. 1 and 2 have been simplified and/or omitted in FIG. 4. More particularly, in the illustrated example of FIG. 4, only the glass substrate or core 202 is shown. However, any of the features shown and/or described in connection with FIGS. 1 and 2 can apply to the example IC package 400 of FIG. 4. For instance, a build-up region 204 can be added to one or both sides of the glass core 202 and semiconductor dies (e.g., the dies 106, 108 of FIG. 1) can be mounted to the build-up regions 204.

As shown in the illustrated example, the glass core 202 includes a cavity or recess defined by a surface 402 that is recessed relative to the (outer) first surface 206 of the glass core 202. A photonic integrated circuit (PIC) 404 is disposed within the cavity adjacent the recessed surface 402. Further, an optical component 406 is also disposed within the cavity adjacent the PIC 404. More particularly, in this examples, the optical component 406 is positioned adjacent a side of the glass core 202 corresponding to a surface 408 extending between the first surface 206 and the recessed surface 402. As a result, the optical component 406 is positioned between the third surface 408 of the glass core 202 and the PIC 404. In some examples the optical component 406 of FIG. 4 corresponds to the optical component 130 of FIGS. 1 and 2.

In the illustrated example of FIG. 4, the optical component 406 is a photonic filter that includes an organic material 410 sandwiched between first and second electrodes 412, 414. More particularly, as shown in the illustrated example, the first electrode 412 is adjacent the third surface 408 of the glass core 202 and between the glass core 202 and the organic material 410, with the second electrode 414 farthest from the third surface 408 and closest to the PIC 404. In some examples, the first electrode 412 is in direct contact with the glass core 202. In other examples, an adhesive, a metal seed layer, and/or another intermediate layer of material may be disposed between the first electrode 412 and the glass core 202. In some examples, an index matching epoxy 416 is provided to fill in any gap between the second electrode 414 and the PIC 404. In some examples, the index matching epoxy 416 is omitted. In this example, each of the electrodes 412, 414 are electrically coupled to a controller (e.g., one of the semiconductor dies 106, 108) in the IC package 400 to control application of a voltage across the organic material 410. Additionally or alternatively, in some examples, voltage control for the electrodes 412, 414 may be provided by a controller external to the IC package 400. In such examples, the external controller can be electrically coupled to the electrodes 412, 414 via TGVs (not shown) extending through the glass core 202.

In the illustrated example of FIG. 4, the glass core 202 includes and/or defines a waveguide 418 through which light is directed along an optical path towards the optical component 406. More particularly, in some examples, the waveguide 418 is embedded in the glass core 202 using any suitable fabrication process (e.g., ion exchange, laser direct lining, etc.). the waveguide 418 directs light to irradiate on and/or pass through the organic material 410 and toward an optical receiver on the side of the PIC 404. In this case, the organic material 410 has an electrochromic property so as to vary a transmittance of light in response to a change in voltage applied across the organic material 410. In this manner, the optical component 406 is able to operate as a photonic filter. In some examples, the light is able to pass through the first electrode 412 to reach the organic material 410 because the first electrode 412 is composed of a transparent material. Additionally or alternatively, in some examples, the light is able to pass through the first electrode 412 to reach the organic material 410 because the first electrode 412 includes openings extending therethrough.

In some examples, the organic materials 308, 410 employed in FIGS. 3 and 4 include conjugated polymers that have alternating single and double carbon bonds. In some examples, the organic materials 308, 410 include a metal-organic supramolecule or polymer (e.g., coordination metallopolymers, which are characterized by intense metal-to-ligand charge transfer or ligand-to-metal charge transfer transitions in the visible region with energies and absorptivities that are largely dependent on the redox states of the metals and ligands). Organic conjugated polymers and metal-organic supramolecule are electrically conductive with photoactive properties that vary their conductivity in response to changes in electromagnetic radiation. Furthermore, in some examples, the organic materials 308, 410 are soluble in typical organic solvents such as acetonitrile. As a result, such materials can be applied to surfaces using spray coating, spin coating or casting methods to facilitate fabrication processes. Furthermore, such materials can be patterned relatively easily. Furthermore, such materials are more mechanically flexible than traditional silicon and/or germanium-based optical components.

Figure 5:
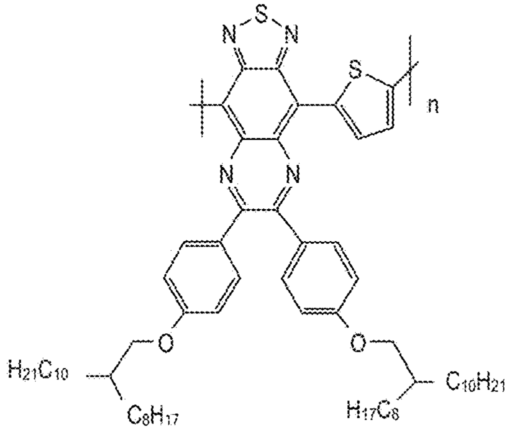
FIGS. 5-7 illustrate example chemical structures of conjugated polymers which may be used for the organic material in the example photodetector of FIG. 3 and/or the example photonic filter of FIG. 4.
Figure 6:
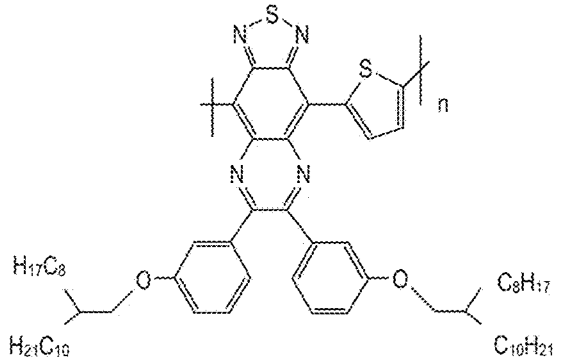
Figure 7:
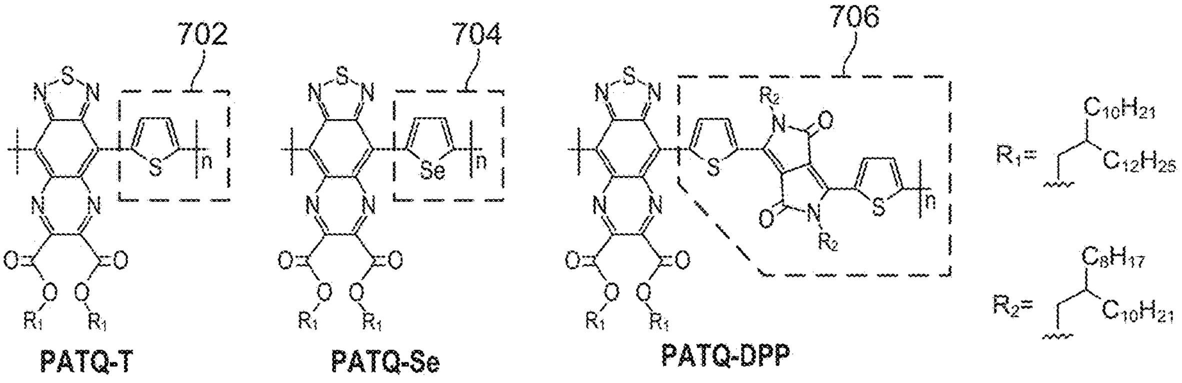

As a specific example, in some instances, the organic materials 308, 410 are thiadiazoloquinoxaline-based polymers, such as those having a chemical structure represented in FIGS. 5-7. Thiadiazoloquinoxaline-based polymers represented in FIGS. 4 and 5 exhibit relatively high absorption of light at particular wavelengths (relative to other wavelengths) in the range of 1200 nm to 1600 nm with a peak or maximum absorption at wavelengths between about 1400 nm and 1500 nm, which is suitable for many infrared-based photonic applications. Further, the wavelength of peak or maximum absorption of thiadiazoloquinoxaline-based polymers can be modified or tuned by changing the molecules used in the polymer backbone. More particularly, FIG. 6 shows a first molecule 902 in an example polymer backbone corresponding to thiophene (T), a second molecule 904 in an example polymer backbone corresponding to selenophene (Se), and a third molecule 906 in an example polymer backbone corresponding to diketopyrrolopyrrole (DPP). Using the first molecule 902 (thiophene) results in a peak absorption at a wavelength of approximately 1100 nm. Using the second molecule 904 (selenophene) results in a peak absorption at a wavelength of approximately 1300 nm. Using the third molecule 906 (diketopyrrolopyrrole) results in a peak absorption at a wavelength of approximately 1500 nm. Thus, the chemical structure of the polymers used in disclosed examples for the organic materials 308, 410 can be tailored to easily tune the particular wavelength or associated range of wavelengths with which the optical component is to interact.

Further, conjugated polymers (such as thiadiazoloquinoxaline-based polymers) have electrochromic properties in which the opacity or optical absorption/transmittance of the material changes in response to different voltages applied to the material. For instance, testing of the chemical structure shown in FIG. 6 indicates a transmittance (at the peak absorption wavelength of 1415 nm) of approximately 35% at a voltage of 0.8 volts and a transmittance of approximately 5% at a voltage of −0.2 volts. Furthermore, testing has shown the absorption/transmittance can change relatively quickly to provide a relatively rapid response time (e.g., less than or equal to one second).

Figure 8:
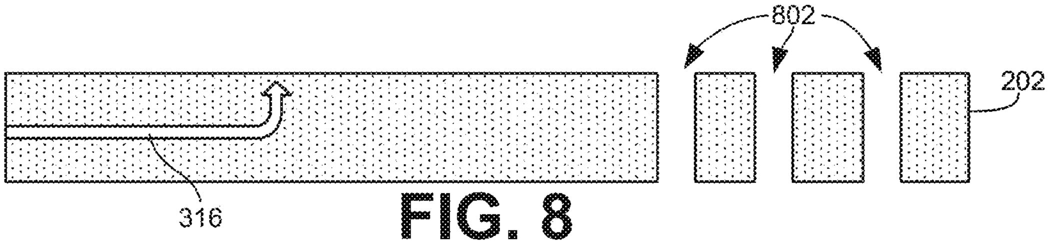
FIGS. 8-12 illustrate different stages in an example process of manufacturing the example IC package of FIG. 3.
Figure 9:
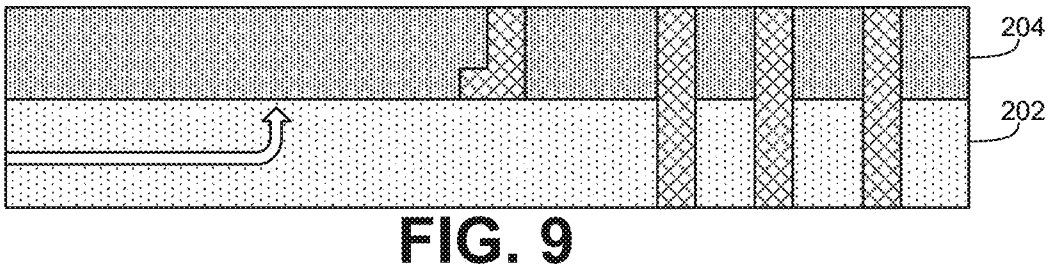
Figure 10:
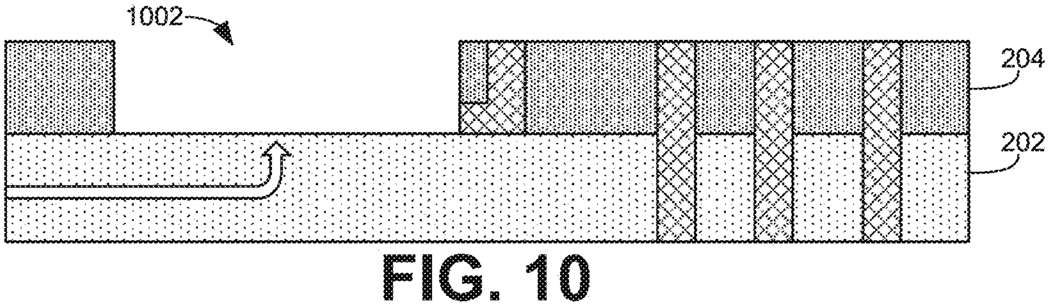
Figure 11:
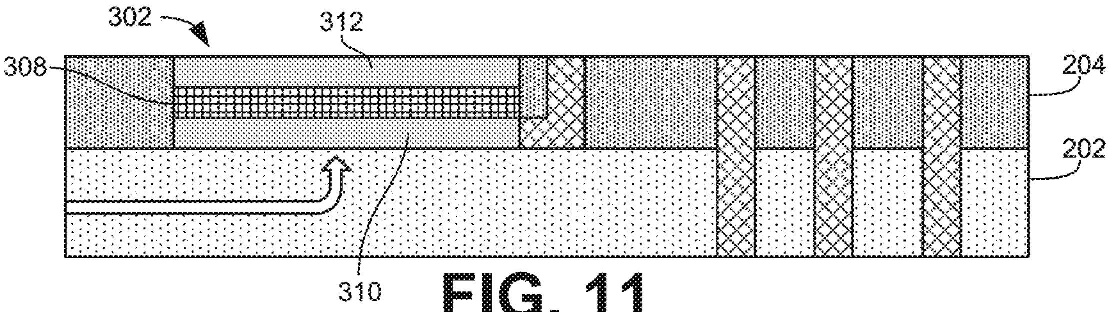
Figure 12:
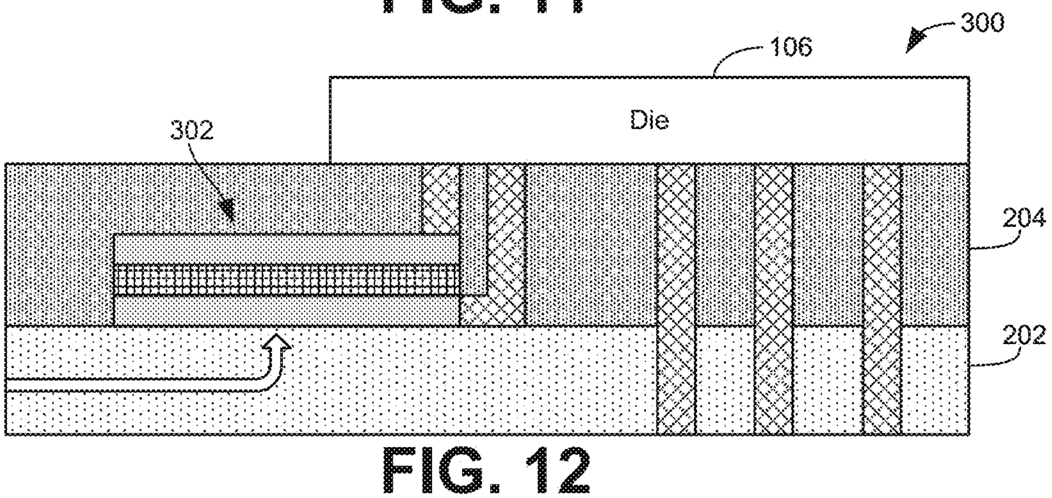

FIGS. 8-12 illustrate different stages in an example process of manufacturing the example IC package 300 of FIG. 3. FIG. 8 represents the example glass substrate or core 202 that has been shaped for use in the IC package 300. More particularly, in some examples, through holes 802 are added (e.g., via laser drilling and/or etching) to extend through the glass core 202. Further, FIG. 8 represents the waveguide 316 defined within the glass core 202. In other example, the waveguide 316 can be added to the glass core 202 at a later stage in the manufacturing process. FIG. 9 represents the through holes 802 after being metal plated and after at least some layers within the build-up region 204 are added to the surface of the glass core 202. In this examples, at the stage of manufacture represented in FIG. 9, the build-up region 204 is fabricated up to a height corresponding to a thickness of the optical component 302. FIG. 10 represents a cavity 1002 provided (e.g., via etching) in the build-up region 204 to expose a portion of the glass core 202. FIG. 11 represents the fabrication of the optical component 302 within the cavity 1002. More particularly, in some examples, the conductive material (e.g., metal) for the first electrode 310 is deposited in the base of the cavity 1002 using any suitable process (e.g., electrolytic plating, electroless plating, sputtering, chemical deposition, plasma deposition, etc.). Thereafter, the organic material 308 is deposited over the material for the first electrode 310. Due to the nature of the organic material 308, many possible processes can be used to deposit the material (e.g., spray coating, spin coating, casting, sputtering, chemical deposition, plasma deposition, etc.). Further, any excess organic material that needs to be removed can be easily accomplished via any suitable process (e.g., dry etch, wet etch, etc.). Once the organic material 308 has been deposited, the conductive material (e.g., metal) for the second electrode 310 is applied to complete the process (after removing (e.g., etching) any excess material added during the deposition processes). FIG. 12 represents the completion of the build-up region 204 including the area over the optical component 302 and the subsequent attachment of the die 106 to arrive at the stage of fabrication for the IC package 300 represented in FIG. 3. In some examples, the IC package 300 shown in FIGS. 3 and 12 may undergo further processing before the package is finally completed.

Variations to the general process flow outlined in FIGS. 8-12 are possible. For instance, in some examples, the entire build-up region 204 is provided before the cavity 1002 is formed and the optical component 302 is disposed therein. In such examples, the space within the cavity over the second electrode 312 can be filled with a filler material (e.g., a dielectric material) without additional processing of the build-up region 204. In other examples, the different layers in the optical component 302 are deposited as corresponding layers in the build-up region 204 are being added. That is, in some examples, the build-up region 204 is provided up to a height that is less than the thickness of the optical component 302 when the materials of the optical component 302 are first deposited. In other examples, the optical component 302 is fabricated on the glass core 202 prior to adding any of the layers of the build-up region 204.

Figure 13:
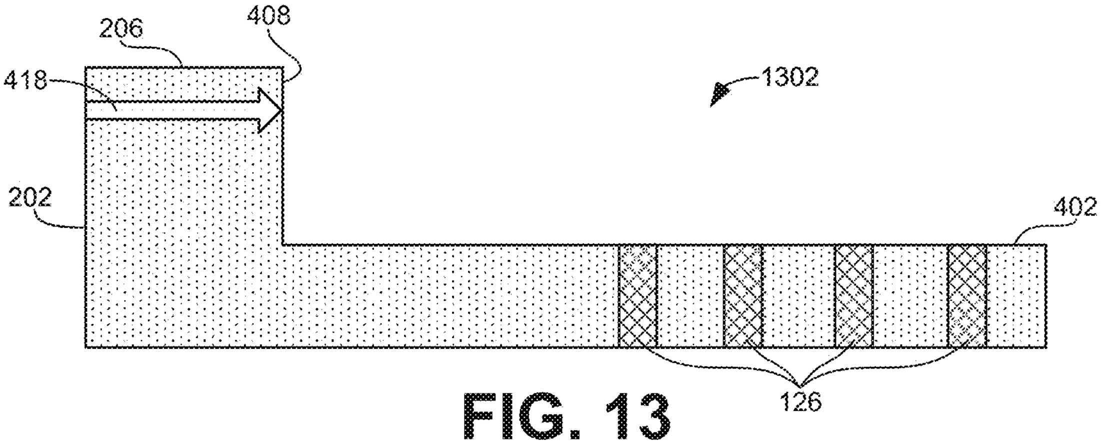
FIGS. 13-18 illustrate different stages in an example process of manufacturing the example IC package of FIG. 4.
Figure 14:
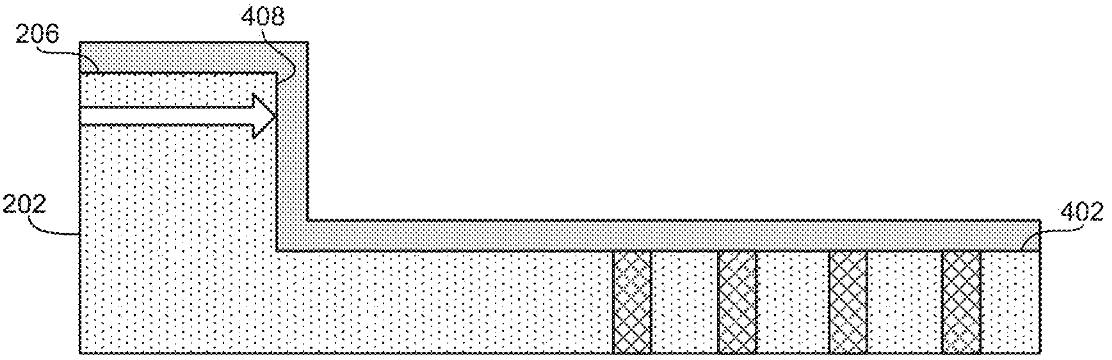
Figure 15:
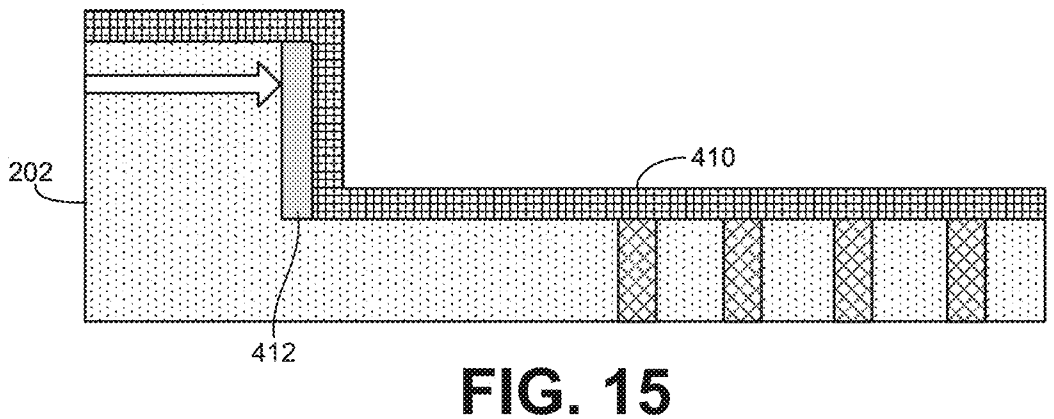

FIGS. 13-18 illustrate different stages in an example process of manufacturing the example IC package 400 of FIG. 4. FIG. 13 represents the example glass substrate or core 202 after having been shaped for use in the IC package 400. More particularly, in this example, a cavity 1302 is formed in the glass core 202 (e.g., via etching or laser drilling) that is defined by the recessed surface 402 and the side surface 408 relative to the outer surface 206 of the glass core 202. Further, at the stage of manufacture represented in FIG. 13, the waveguide 418 has been defined within the glass core 202. Additionally, in this example, metal interconnects 126 (e.g., TGVs) have been provided to extend through the glass core 202. In some examples, other TGVs may be added to provide electrical routing for the electrodes of the optical component to be added to the glass core 202. FIG. 14 represents the conductive material (e.g., metal) for the first electrode 310 deposited over the exposed surfaces (e.g., the first surface 206, the second (recessed) surface 402, and the third (side) surface 408) of the in the glass core 202. The deposition of the conductive material can be accomplished using any suitable process (e.g., electrolytic plating, electroless plating, sputtering, chemical deposition, plasma deposition, etc.). FIG. 15 represents the conductive material for the first electrode 310 being removed (e.g., via etching) along the outer surface 206 and the recessed surface 402 while retaining the material adjacent the side surface 408 corresponding to the first electrode 310. Further, FIG. 15 represents the organic material 410 deposited over the first electrode 412 and the glass core 202 using any suitable process (e.g., spray coating, spin coating, casting, sputtering, chemical deposition, plasma deposition, etc.).

Figure 16:
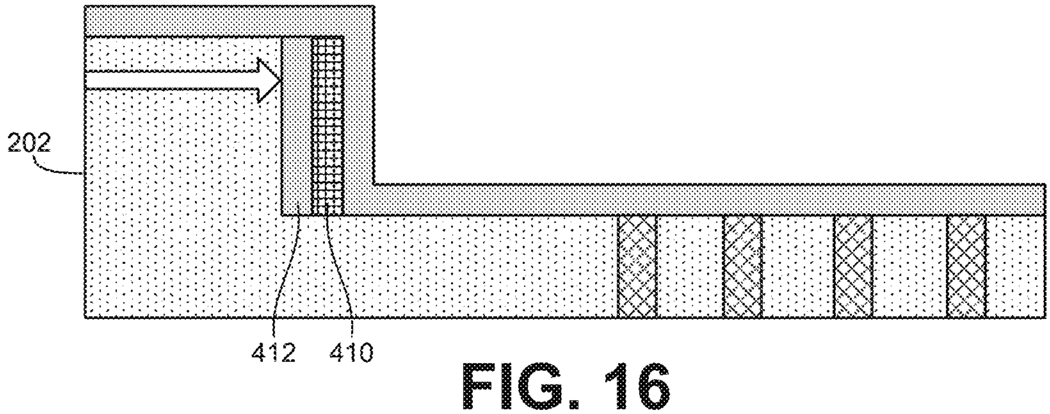
Figure 17:
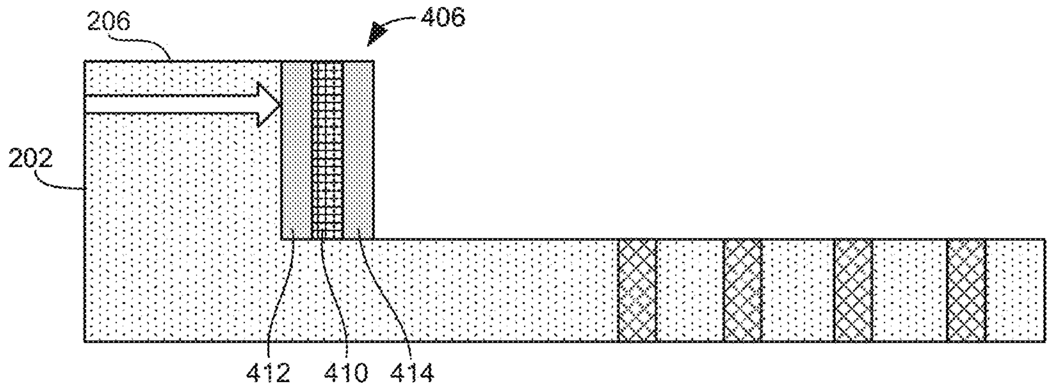
Figure 18:
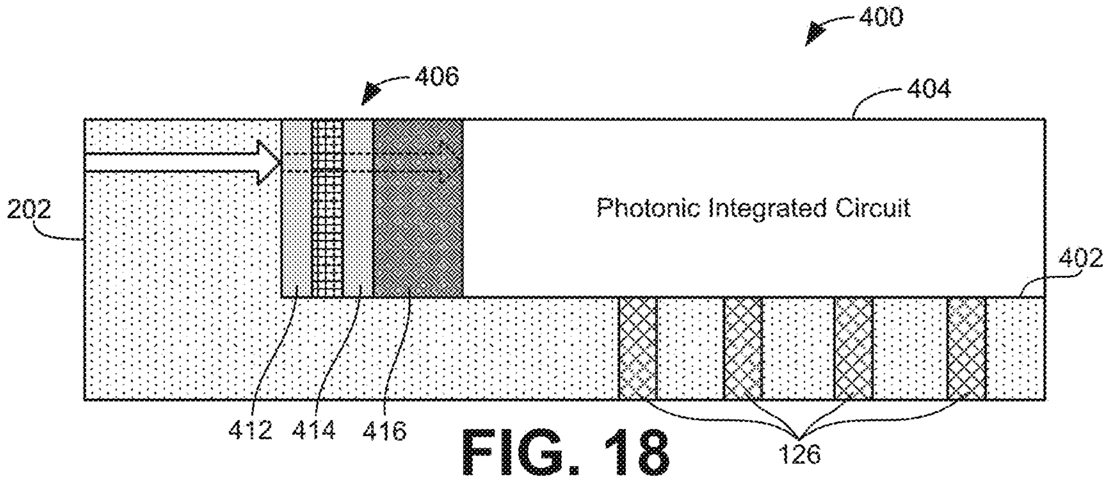

FIG. 16 represents the organic material 410 being removed (e.g., via either dry etching or wet etching) everywhere except adjacent the first electrode 310. Further, FIG. 16 represents the conductive material (e.g., metal) for the second electrode 310 deposited over the glass core 202, the first electrode 412, and the organic material 410 using any suitable process (e.g., electrolytic plating, electroless plating, sputtering, chemical deposition, plasma deposition, etc.). FIG. 17 represents the removal (e.g., via etching) of the conductive material to define the second electrode 414 adjacent the organic material 410, thereby defining the basis structure for the optical component 406. As outlined above, each layer of material in the optical component 406 was separately deposited and removed from the outer surface 206 of the glass core 202. However, in other examples, one or more of the underlying layers of materials can remain on the outer surface 206 as subsequent layers of material are deposited thereon. In such examples, the stack of layers formed on the outer surface 206 can be removed in a single process (e.g., via etching, planarization, etc.). FIG. 18 represents the PIC 404 being disposed on the recessed surface 402, and the addition of the index matching epoxy 416 between the PIC 404 and the optical component 406. Thus, FIG. 18 represents the stage of fabrication for the IC package 400 represented in FIG. 4. In some examples, the IC package 400 shown in FIGS. 4 and 18 may undergo further processing before the package is finally completed. For instance, build-up regions on one or both sides of the glass core 202 (including over the optical component 406 and/or the PIC 404) can be added and other semiconductor dies can be electrically coupled thereto. In some examples, metal interconnects are included in the build-up region adjacent the optical component 406 to provide electrical routing for the electrodes 412, 414 of the optical component 406.

Figure 19:
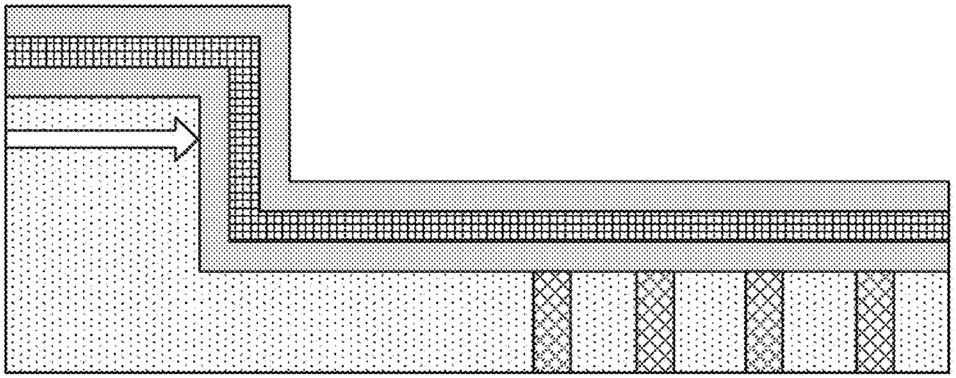
FIGS. 19-21 illustrate different stages in an example process of manufacturing another example IC package similar to the IC package of FIG. 4.
Figure 20:
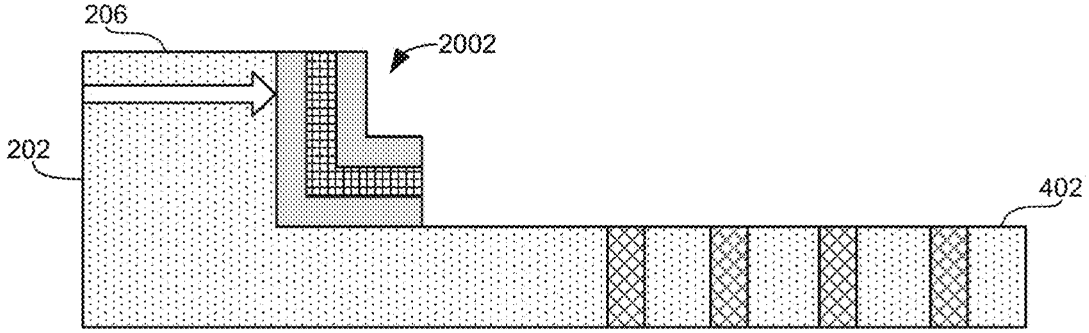
Figure 21:
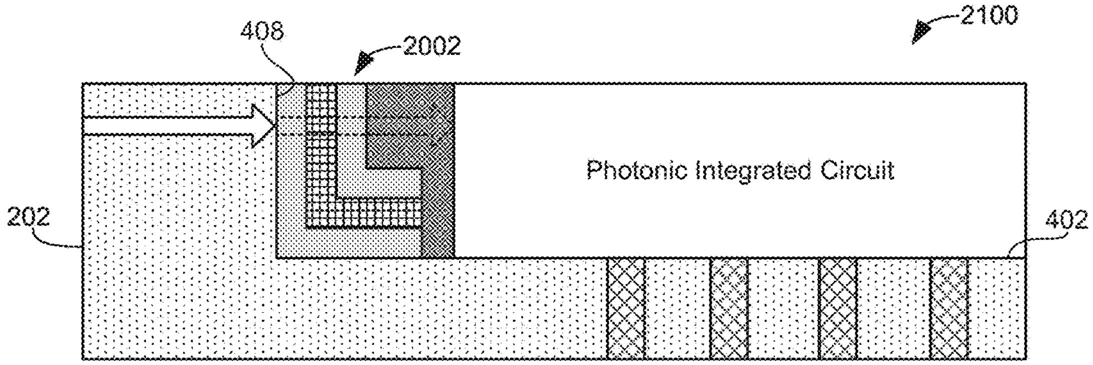

FIGS. 19-21 illustrate various stages in an example process of manufacturing another example IC package 2100 similar to the IC package of FIG. 4. The process represented in FIGS. 19-21 is similar to the process detailed in FIGS. 13-18 except that all three layers of materials used in the optical component 406 are deposited over the glass core 202 before any of the materials are removed (as represented in FIG. 19). FIG. 20 represents the removal of all three materials from the outer surface 206 and the recessed surface of the glass core 202. The remaining material is to serve as the basic structure for an optical component 2002 similar to the optical component 406 of FIG. 4. FIG. 21 represents the stage of fabrication for the IC package 2100 up to a point similar to that shown in FIG. 18 for the IC package 400 of FIG. 4. As shown in the illustrated examples, due to the order of fabrication processes, the optical component 2002 not only extends along the side surface 408 of the glass core 202 but also extends at least partially along the recessed surface 402.

Figure 22:
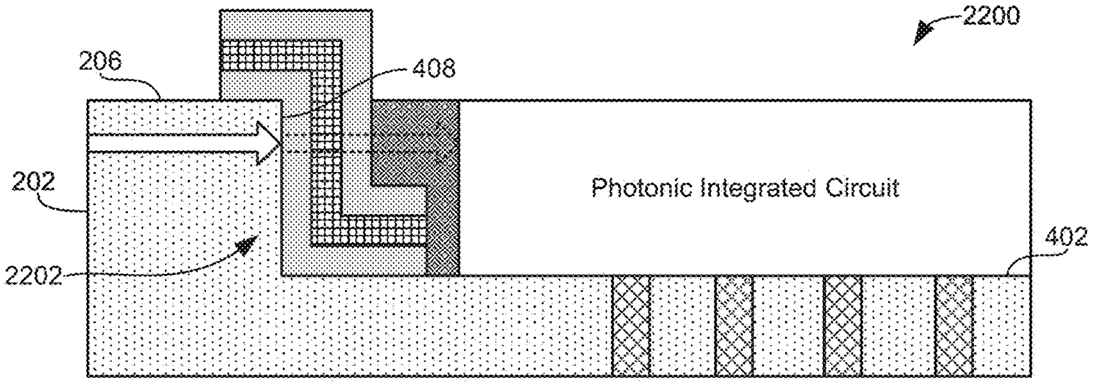
FIG. 22 illustrate another example IC package fabricated based on processes similar to those illustrated in FIGS. 19-21.

FIG. 22 illustrate another example IC package 2200 fabricated based on processes similar to those illustrated in FIGS. 19-21. In this example, the IC package 2200 includes an optical component 2202 that extends along the side surface 408, at least a portion of the recessed surface 402, and also at least a portion of the outer surface 206 of the glass core 202.

Figure 23:
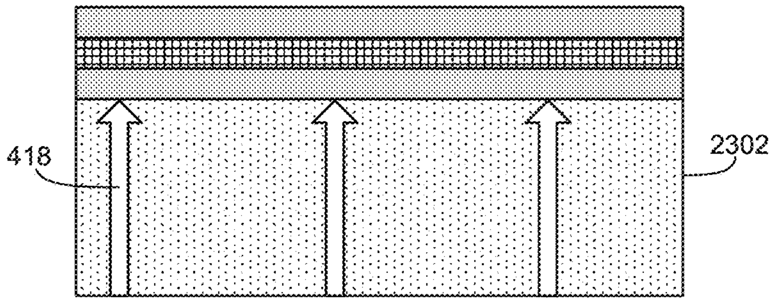
FIGS. 23-26 illustrate different stages in another example process of manufacturing the example IC package of FIG. 4.
Figure 24:
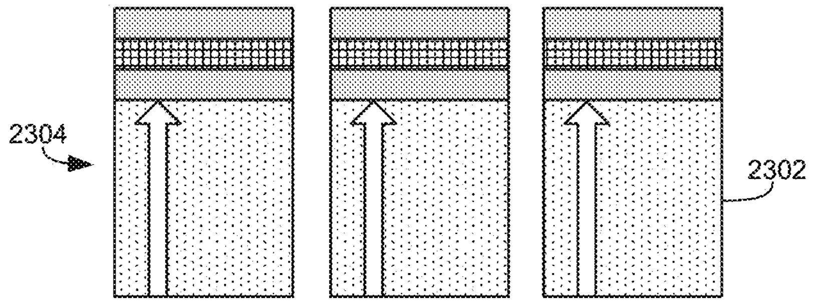
Figure 25:
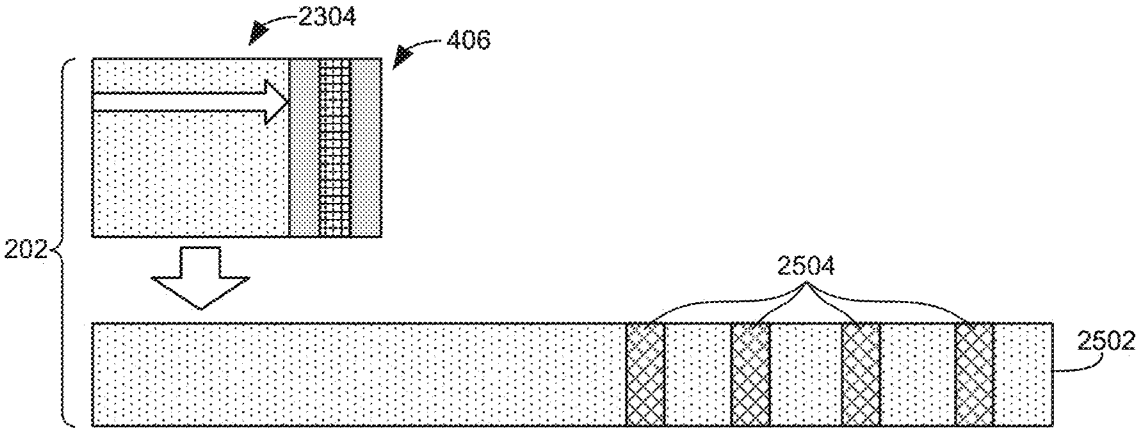
Figure 26:
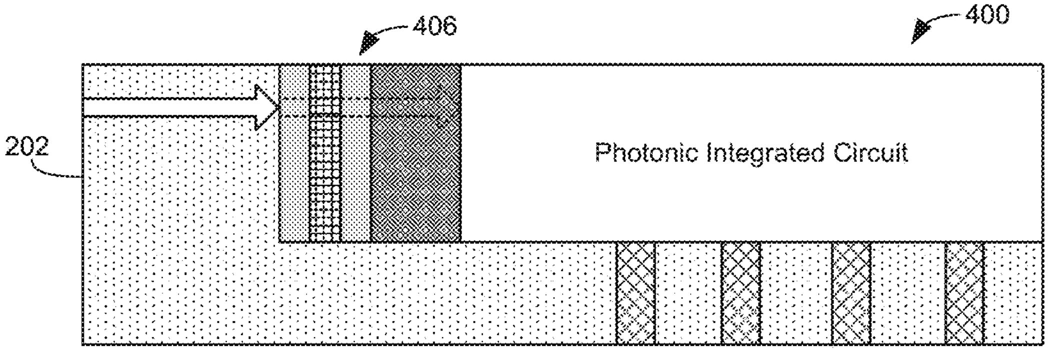

FIGS. 23-26 illustrate various stages in another example process of manufacturing the example IC package 400 of FIG. 4. In this example, as represented in FIG. 23, a first glass substrate 2302 is provided upon which the different layers of material for the optical component 406 are deposited. Further, in this example, one or more waveguides 418 are defined within the glass substrate 2302. Each of the waveguides 418 can be used for a different IC package. In particular, as shown in FIG. 24, the glass substrate 2302 and the layers of materials deposited thereon are cut or singulated into separate assemblies 2304. FIG. 25 represents one of the assemblies being bonded to a second glass substrate 2502. In some examples, the pieces of glass can be bonded together in any suitable manner (e.g., using an adhesive, fusion bonding, etc.). In this example, the second glass substrate 2502 has already been processed to include TGVs 2504 to be electrically coupled to the PIC. In some examples, other TGVs may be added to provide electrical routing for the electrodes of the optical component to be added to the glass core 202. In other examples, the TGVs can be added later. The combination of the portion of the first glass substrate 2302 in the assembly 2304 and the second glass substrate 2502 defines the glass core 202 of the example IC package 400 of FIG. 4. Further, the portion of the layers of materials on the assembly 2304 corresponds to the basic structure for the optical component 406. FIG. 26 represents the stage of fabrication for the IC package 400 up to a point similar to that shown in FIG. 18 for the IC package 400 of FIG. 4.

While different manufacturing processes have been shown and described in connection with FIGS. 8-26, any of the processes and/or resulting architectures described in any one of FIGS. 8-26 can be used in combination with and/or instead of the processes and/or resulting structures described in any other ones of FIGS. 8-26. Furthermore, the example IC package 300 of FIG. 3 and the example IC package 400 of FIG. 4 are not mutually exclusive but can be combined within a single package. That is, in some examples, a single IC package may include both a photodetector (as represented in FIG. 3) and a photonic filter (as represented in FIG. 4). In some examples, a single optical component (e.g., either the optical component 302 of FIG. 3 or the optical component 406 of FIG. 4) can be constructed and electrically coupled within an IC package to function as both a photodetector and a photonic filter.

Figure 27:
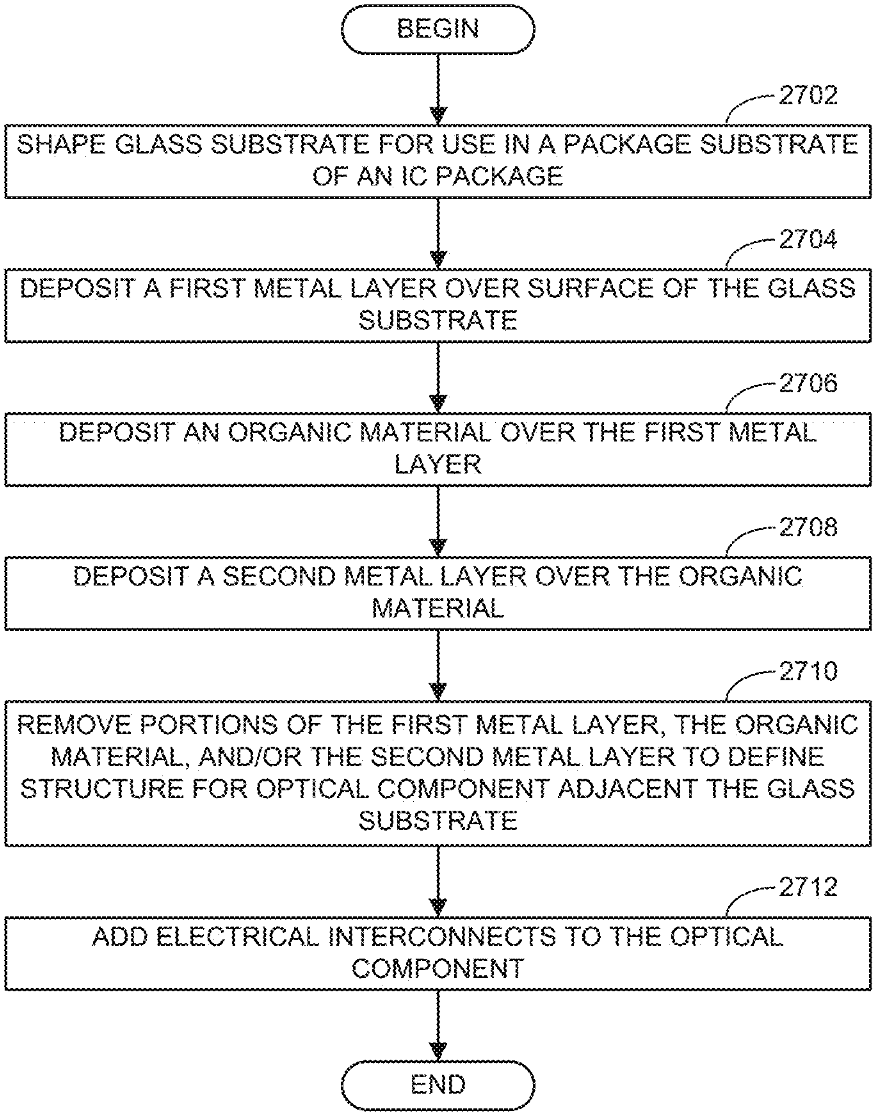
FIG. 27 is a flowchart representative of an example method of manufacturing the example IC packages disclosed herein.

FIG. 27 is a flowchart illustrating an example method of manufacturing any one of the example IC packages 100, 300, 400, 2100, 2200 disclosed above. Although the example method of manufacture is described with reference to the flowchart illustrated in FIG. 27, many other methods may alternatively be used. For example, the order of execution of the blocks may be changed, and/or some of the blocks described may be combined, divided, re-arranged, omitted, eliminated, and/or implemented in any other way. Further, in some examples, additional processing operations can be performed before, between, and/or after any of the blocks represented in the illustrated example.

The example process begins at block 2702 by shaping a glass substrate (e.g., the glass core 202 of FIG. 2) for use in a package substrate of an IC package. In some examples, the shaping of the glass substrate includes providing through holes for TGVs through the substrate. In some examples, the shaping includes creating a cavity or recess in the substrate within which components are to be disposed. In some examples, the shaping of the glass core 202 includes the providing of multiple pieces of glass that are to be subsequently bonded together.

At block 2704, a first metal layer is deposited over a surface of the glass substrate. At block 2706, an organic material is deposited over the first metal layer. At block 2708, a second metal layer is deposited over the organic material. Any suitable deposition process may be employed to deposit the materials at blocks 2704-2708. At block 2710, portions of the first metal layer, the organic materials, and/or the second metal layer are removed to define the structure for an optical component adjacent the glass substrate. In some examples, portions of different ones of the layers are removed (e.g., via etching) prior to the deposition of the next layer of material. In other examples, two or more of the layers may be removed during a single operation. In some examples, the removal of portions of the materials is accomplished by cutting or singulating a glass substrate on which the materials were deposited (as described above in connection with FIGS. 23 and 24).

At block 2712, electrical interconnects are added to the optical component to enable the component to interact with other components within the IC package and/or to interact with components external to the IC package. In some examples, the electrical interconnects include TGVs extending through the glass substrate. Additionally or alternatively, in some examples, the electrical interconnects include metal vias and traces within a build-up region provided on the glass substrate. Thereafter, the example process of FIG. 27 ends. However, additional processing may be performed to complete the fabrication of an IC package (e.g., electrically coupling semiconductor dies, photonic integrated circuits, and/or or other electrical components to the substrate).

The example IC packages 100, 300, 400, 2100, 2200 disclosed herein may be included in any suitable electronic component. FIGS. 28-31 illustrate various examples of apparatus that may include or be included in the IC packages 100, 300, 400, 2100, 2200 disclosed herein.

Figure 28:
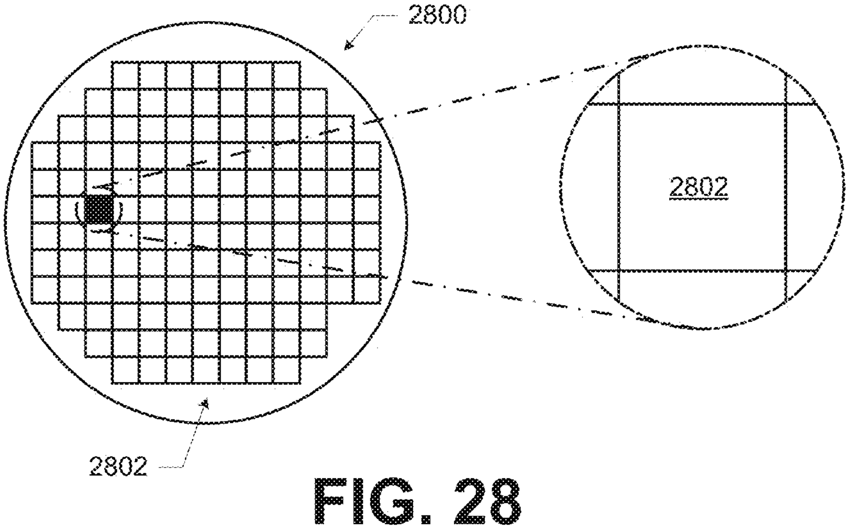
FIG. 28 is a top view of a wafer and dies.

FIG. 28 is a top view of a wafer 2800 and dies 2802 that may be included in the IC packages 100, 300, 400, 2100, 2200 (e.g., as any suitable ones of the dies 106, 108 and/or the PIC 404). The wafer 2800 may be composed of semiconductor material and may include one or more dies 2802 having IC structures formed on a surface of the wafer 2800. Each of the dies 2802 may be a repeating unit of a semiconductor product that includes any suitable IC. After the fabrication of the semiconductor product is complete, the wafer 2800 may undergo a singulation process in which the dies 2802 are separated from one another to provide discrete "chips" of the semiconductor product. The die 2802 may include one or more transistors (e.g., some of the transistors 2940 of FIG. 29, discussed below), supporting circuitry to route electrical signals to the transistors, passive components (e.g., signal traces, resistors, capacitors, or inductors), and/or any other IC components. In some examples, the wafer 2800 or the die 2802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2802. For example, a memory array formed by multiple memory devices may be formed on a same die 2802 as processor circuitry (e.g., the processor circuitry 3102 of FIG. 31) or other logic that is configured to store information in the memory devices or execute instructions stored in the memory array. The example IC packages 100, 300, 400, 2100, 2200 disclosed herein may be manufactured using a die-to-wafer assembly technique in which some dies 106, 108 are attached to a wafer 1900 that include others of the dies 106, 106, and the wafer 2800 is subsequently singulated.

Figure 29:
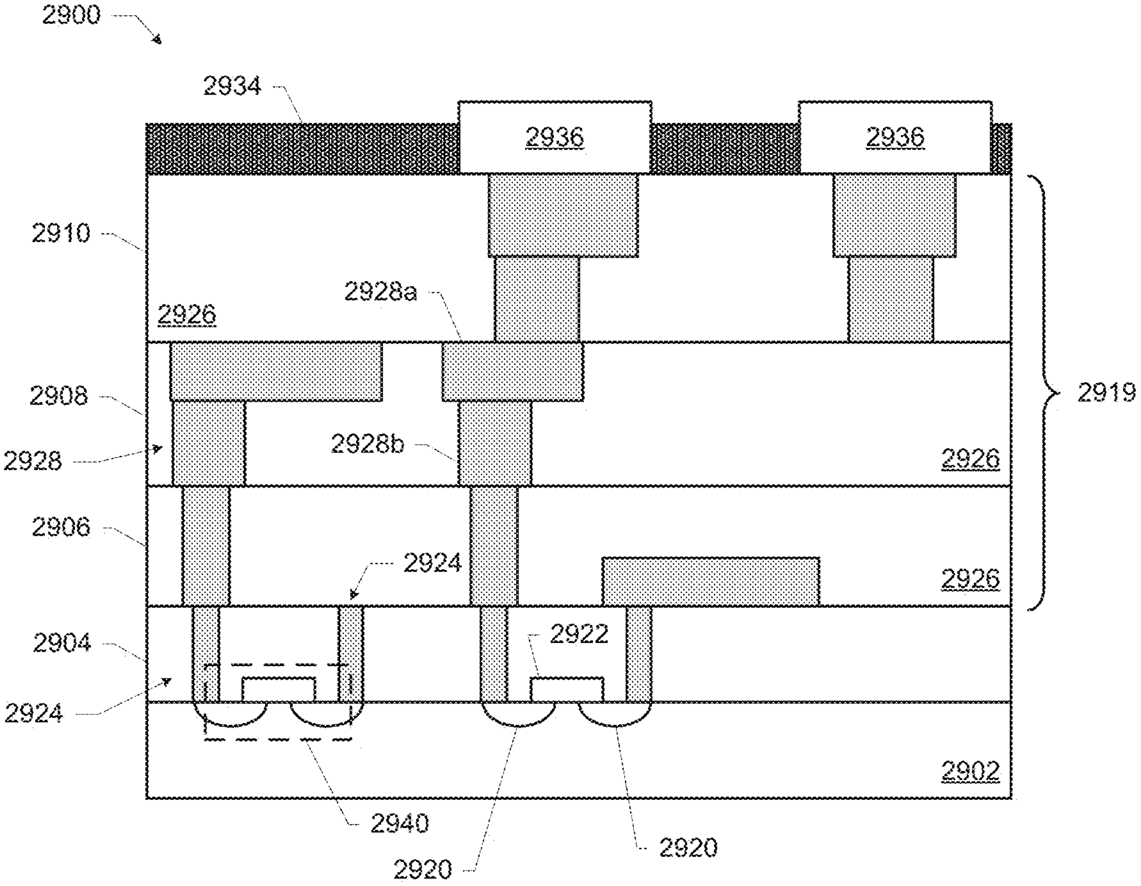
FIG. 29 is a cross-sectional side view of an IC device that may be included in an IC package constructed in accordance with teachings disclosed herein.

FIG. 29 is a cross-sectional side view of an IC device 2900 that may be included in the example IC packages 100, 300, 400, 2100, 2200 (e.g., in any one of the dies 106, 108 or the PIC 404). One or more of the IC devices 2900 may be included in one or more dies 2802 (FIG. 28). The IC device 2900 may be formed on a die substrate 2902 (e.g., the wafer 2800 of FIG. 28) and may be included in a die (e.g., the die 2802 of FIG. 28). The die substrate 2902 may be a semiconductor substrate composed of semiconductor material systems including, for example, n-type or p-type materials systems (or a combination of both). The die substrate 2902 may include, for example, a crystalline substrate formed using a bulk silicon or a silicon-on-insulator (SOI) substructure. In some examples, the die substrate 2902 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2902. Although a few examples of materials from which the die substrate 2902 may be formed are described here, any material that may serve as a foundation for an IC device 2900 may be used. The die substrate 2902 may be part of a singulated die (e.g., the dies 2802 of FIG. 28) or a wafer (e.g., the wafer 2800 of FIG. 28).

The IC device 2900 may include one or more device layers 2904 disposed on the die substrate 2902. The device layer 2904 may include features of one or more transistors 2940 (e.g., metal oxide semiconductor field-effect transistors (MOSFETs)) formed on the die substrate 2902. The device layer 2904 may include, for example, one or more source and/or drain (S/D) regions 2920, a gate 2922 to control current flow in the transistors 2940 between the S/D regions 2920, and one or more S/D contacts 2924 to route electrical signals to/from the S/D regions 2920. The transistors 2940 may include additional features not depicted for the sake of clarity, such as device isolation regions, gate contacts, and the like. The transistors 2940 are not limited to the type and configuration depicted in FIG. 29 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2940 may include a gate 2922 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2940 along the source-channel-drain direction, the gate electrode may consist of a U-shaped structure that includes a bottom portion substantially parallel to the surface of the die substrate 2902 and two sidewall portions that are substantially perpendicular to the top surface of the die substrate 2902. In other examples, at least one of the metal layers that form the gate electrode may simply be a planar layer that is substantially parallel to the top surface of the die substrate 2902 and does not include sidewall portions substantially perpendicular to the top surface of the die substrate 2902. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2920 may be formed within the die substrate 2902 adjacent to the gate 2922 of each transistor 2940. The S/D regions 2920 may be formed using an implantation/diffusion process or an etching/deposition process, for example. In the former process, dopants such as boron, aluminum, antimony, phosphorous, or arsenic may be ion-implanted into the die substrate 2902 to form the S/D regions 2920. An annealing process that activates the dopants and causes them to diffuse farther into the die substrate 2902 may follow the ion-implantation process. In the latter process, the die substrate 2902 may first be etched to form recesses at the locations of the S/D regions 2920. An epitaxial deposition process may then be carried out to fill the recesses with material that is used to fabricate the S/D regions 2920. In some implementations, the S/D regions 2920 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2920 may be formed using one or more alternate semiconductor materials such as germanium or a group III-V material or alloy. In further examples, one or more layers of metal and/or metal alloys may be used to form the S/D regions 2920.

Electrical signals, such as power and/or input/output (I/O) signals, may be routed to and/or from the devices (e.g., transistors 2940) of the device layer 2904 through one or more interconnect layers disposed on the device layer 2904 (illustrated in FIG. 29 as interconnect layers 2906-2010). For example, electrically conductive features of the device layer 2904 (e.g., the gate 2922 and the S/D contacts 2924) may be electrically coupled with the interconnect structures 2928 of the interconnect layers 2906-2010. The one or more interconnect layers 2906-2010 may form a metallization stack (also referred to as an "ILD stack") 2919 of the IC device 2900.

The interconnect structures 2928 may be arranged within the interconnect layers 2906-2010 to route electrical signals according to a wide variety of designs (in particular, the arrangement is not limited to the particular configuration of interconnect structures 2928 depicted in FIG. 29). Although a particular number of interconnect layers 2906-2010 is depicted in FIG. 29, examples of the present disclosure include IC devices having more or fewer interconnect layers than depicted.

In some examples, the interconnect structures 2928 may include lines **2928*a* and/or vias 2928*b* filled with an electrically conductive material such as a metal. The lines 2928*a* may be arranged to route electrical signals in a direction of a plane that is substantially parallel with a surface of the die substrate 2902 upon which the device layer 2904 is formed. For example, the lines 2928*a* may route electrical signals in a direction in and out of the page from the perspective of FIG. 29. The vias 2928*b* may be arranged to route electrical signals in a direction of a plane that is substantially perpendicular to the surface of the die substrate 2902 upon which the device layer 2904 is formed. In some examples, the vias 2928*b* may electrically couple lines 2928*a* of different interconnect layers 2906-2010** together.

The interconnect layers 2906-2010 may include a dielectric material 2926 disposed between the interconnect structures 2928, as shown in FIG. 29. In some examples, the dielectric material 2926 disposed between the interconnect structures 2928 in different ones of the interconnect layers 2906-2010 may have different compositions; in other examples, the composition of the dielectric material 2926 between different interconnect layers 2906-2010 may be the same.

A first interconnect layer 2906 (referred to as Metal 1 or "M1") may be formed directly on the device layer 2904. In some examples, the first interconnect layer 2906 may include lines **2928*a* and/or vias 2928*b*, as shown. The lines 2928*a* of the first interconnect layer 2906 may be coupled with contacts (e.g., the S/D contacts 2924) of the device layer 2904**.

A second interconnect layer 2908 (referred to as Metal 2 or "M2") may be formed directly on the first interconnect layer 2906. In some examples, the second interconnect layer 2908 may include vias **2928*b* to couple the lines 2928*a* of the second interconnect layer 2908 with the lines 2928*a* of the first interconnect layer 2906. Although the lines 2928*a* and the vias 2928*b* are structurally delineated with a line within each interconnect layer (e.g., within the second interconnect layer 2908) for the sake of clarity, the lines 2928*a* and the vias 2928*b*** may be structurally and/or materially contiguous (e.g., simultaneously filled during a dual-damascene process) in some examples.

A third interconnect layer 2910 (referred to as Metal 3 or "M3") (and additional interconnect layers, as desired) may be formed in succession on the second interconnect layer 2908 according to similar techniques and configurations described in connection with the second interconnect layer 2908 or the first interconnect layer 2906. In some examples, the interconnect layers that are "higher up" in the metallization stack 2919 in the IC device 2900 (i.e., further away from the device layer 2904) may be thicker.

The IC device 2900 may include a solder resist material 2934 (e.g., polyimide or similar material) and one or more conductive contacts 2936 formed on the interconnect layers 2906-2010. In FIG. 29, the conductive contacts 2936 are illustrated as taking the form of bond pads. The conductive contacts 2936 may be electrically coupled with the interconnect structures 2928 and configured to route the electrical signals of the transistor(s) 2940 to other external devices. For example, solder bonds may be formed on the one or more conductive contacts 2936 to mechanically and/or electrically couple a chip including the IC device 2900 with another component (e.g., a circuit board). The IC device 2900 may include additional or alternate structures to route the electrical signals from the interconnect layers 2906-2010; for example, the conductive contacts 2936 may include other analogous features (e.g., posts) that route the electrical signals to external components.

Figure 30:
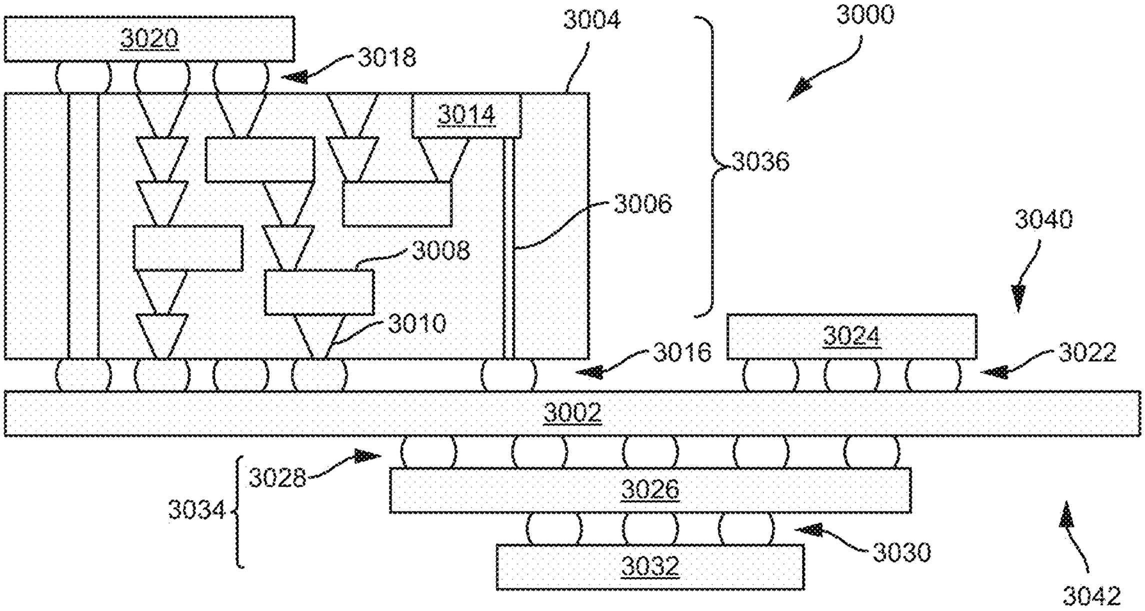
FIG. 30 is a cross-sectional side view of an IC device assembly that may include an IC package constructed in accordance with teachings disclosed herein.

FIG. 30 is a cross-sectional side view of an IC device assembly 3000 that may include one or more of the IC packages 100, 300, 400, 2100, 2200 disclosed herein. In some examples, the IC device assembly corresponds to one or more of the IC packages 100, 300, 400, 2100, 2200. The IC device assembly 3000 includes a number of components disposed on a circuit board 3002 (which may be, for example, a motherboard). The IC device assembly 3000 includes components disposed on a first face 3040 of the circuit board 3002 and an opposing second face 3042 of the circuit board 3002; generally, components may be disposed on one or both faces 3040 and 3042. Any of the IC packages discussed below with reference to the IC device assembly 3000 may take the form of any one of the example IC packages 100, 300, 400, 2100, 2200.

In some examples, the circuit board 3002 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 3002. In other examples, the circuit board 3002 may be a non-PCB substrate. In some examples, the circuit board 3002 may be, for example, the circuit board 102 of FIG. 1.

The IC device assembly 3000 illustrated in FIG. 30 includes a package-on-interposer structure 3036 coupled to the first face 3040 of the circuit board 3002 by coupling components 3016. The coupling components 3016 may electrically and mechanically couple the package-on-interposer structure 3036 to the circuit board 3002, and may include solder balls (as shown in FIG. 30), male and female portions of a socket, an adhesive, an underfill material, and/or any other suitable electrical and/or mechanical coupling structure.

The package-on-interposer structure 3036 may include an IC package 3020 coupled to an interposer 3004 by coupling components 3018. The coupling components 3018 may take any suitable form for the application, such as the forms discussed above with reference to the coupling components 3016. Although a single IC package 3020 is shown in FIG. 30, multiple IC packages may be coupled to the interposer 3004; indeed, additional interposers may be coupled to the interposer 3004. The interposer 3004 may provide an intervening substrate used to bridge the circuit board 3002 and the IC package 3020. The IC package 3020 may be or include, for example, a die (the die 2802 of FIG. 28), an IC device (e.g., the IC device 2900 of FIG. 29), or any other suitable component. Generally, the interposer 3004 may spread a connection to a wider pitch or reroute a connection to a different connection. For example, the interposer 3004 may couple the IC package 3020 (e.g., a die) to a set of BGA conductive contacts of the coupling components 3016 for coupling to the circuit board 3002. In the example illustrated in FIG. 30, the IC package 3020 and the circuit board 3002 are attached to opposing sides of the interposer 3004; in other examples, the IC package 3020 and the circuit board 3002 may be attached to a same side of the interposer 3004. In some examples, three or more components may be interconnected by way of the interposer 3004.

In some examples, the interposer 1704 may be formed as a PCB, including multiple metal layers separated from one another by layers of dielectric material and interconnected by electrically conductive vias. In some examples, the interposer 1704 may be formed of an epoxy resin, a fiberglass-reinforced epoxy resin, an epoxy resin with inorganic fillers, a ceramic material, or a polymer material such as polyimide. In some examples, the interposer 3004 may be formed of alternate rigid or flexible materials that may include the same materials described above for use in a semiconductor substrate, such as silicon, germanium, and other group III-V and group IV materials. The interposer 3004 may include metal interconnects 3008 and vias 3010, including but not limited to through-silicon vias (TSVs) 3006. The interposer 3004 may further include embedded devices 3014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 3004. The package-on-interposer structure 3036 may take the form of any of the package-on-interposer structures known in the art.

The IC device assembly 3000 may include an IC package 3024 coupled to the first face 3040 of the circuit board 3002 by coupling components 3022. The coupling components 3022 may take the form of any of the examples discussed above with reference to the coupling components 3016, and the IC package 3024 may take the form of any of the examples discussed above with reference to the IC package 3020.

The IC device assembly 3000 illustrated in FIG. 30 includes a package-on-package structure 3034 coupled to the second face 3042 of the circuit board 3002 by coupling components 3028. The package-on-package structure 3034 may include a first IC package 3026 and a second IC package 3032 coupled together by coupling components 3030 such that the first IC package 3026 is disposed between the circuit board 3002 and the second IC package 3032. The coupling components 3028, 3030 may take the form of any of the examples of the coupling components 3016 discussed above, and the IC packages 3026, 3032 may take the form of any of the examples of the IC package 3020 discussed above. The package-on-package structure 3034 may be configured in accordance with any of the package-on-package structures known in the art.

Figure 31:
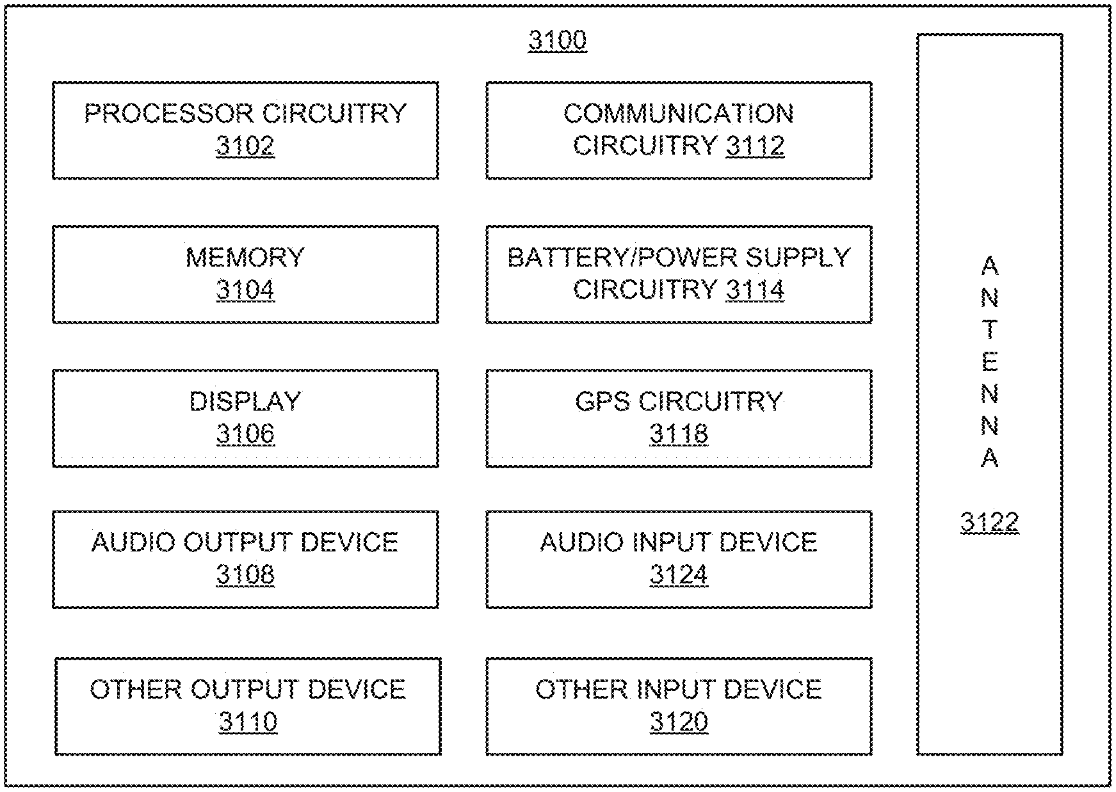
FIG. 31 is a block diagram of an example electrical device that may include an IC package constructed in accordance with teachings disclosed herein.

FIG. 31 is a block diagram of an example electrical device 3100 that may include one or more of the example IC packages 100, 300, 400, 2100, 2200 disclosed herein. For example, any suitable ones of the components of the electrical device 3100 may include one or more of the device assemblies 3000, IC devices 2900, or dies 2802 disclosed herein, and may be arranged in the example IC packages 100, 300, 400, 2100, 2200. A number of components are illustrated in FIG. 31 as included in the electrical device 3100, but any one or more of these components may be omitted or duplicated, as suitable for the application. In some examples, some or all of the components included in the electrical device 3100 may be attached to one or more motherboards. In some examples, some or all of these components are fabricated onto a single system-on-a-chip (SoC) die.

Additionally, in various examples, the electrical device 3100 may not include one or more of the components illustrated in FIG. 31, but the electrical device 3100 may include interface circuitry for coupling to the one or more components. For example, the electrical device 3100 may not include a display 3106, but may include display interface circuitry (e.g., a connector and driver circuitry) to which a display 3106 may be coupled. In another set of examples, the electrical device 3100 may not include an audio input device 3124 (e.g., microphone) or an audio output device 3108 (e.g., a speaker, a headset, earbuds, etc.), but may include audio input or output device interface circuitry (e.g., connectors and supporting circuitry) to which an audio input device 3124 or audio output device 3108 may be coupled.

The electrical device 3100 may include a processor circuitry 3102 (e.g., one or more processing devices). As used herein, the term "processing device" or "processor" may refer to any device or portion of a device that processes electronic data from registers and/or memory to transform that electronic data into other electronic data that may be stored in registers and/or memory. The processor circuitry 3102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 3100 may include a memory 3104, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 3104 may include memory that shares a die with the processor circuitry 3102. This memory may be used as cache memory and may include embedded dynamic random access memory (eDRAM) or spin transfer torque magnetic random access memory (STT-MRAM).

In some examples, the electrical device 3100 may include a communication circuitry 3112 (e.g., one or more communication chips). For example, the communication circuitry 3112 may be configured for managing wireless communications for the transfer of data to and from the electrical device 3100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication circuitry 3112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication circuitry 3112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication circuitry 3112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication circuitry 3112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication circuitry 3112 may operate in accordance with other wireless protocols in other examples. The electrical device 3100 may include an antenna 3122 to facilitate wireless communications and/or to receive other wireless communications (such as AM or FM radio transmissions).

In some examples, the communication circuitry 3112 may manage wired communications, such as electrical, optical, or any other suitable communication protocols (e.g., the Ethernet). As noted above, the communication circuitry 3112 may include multiple communication chips. For instance, a first communication circuitry 3112 may be dedicated to shorter-range wireless communications such as Wi-Fi or Bluetooth, and a second communication circuitry 3112 may be dedicated to longer-range wireless communications such as global positioning system (GPS), EDGE, GPRS, CDMA, WiMAX, LTE, EV-DO, or others. In some examples, a first communication circuitry 3112 may be dedicated to wireless communications, and a second communication circuitry 3112 may be dedicated to wired communications.

The electrical device 3100 may include battery/power supply circuitry 3114. The battery/power supply circuitry 3114 may include one or more energy storage devices (e.g., batteries or capacitors) and/or circuitry for coupling components of the electrical device 3100 to an energy source separate from the electrical device 3100 (e.g., AC line power).

The electrical device 3100 may include a display 3106 (or corresponding interface circuitry, as discussed above). The display 3106 may include any visual indicators, such as a heads-up display, a computer monitor, a projector, a touchscreen display, a liquid crystal display (LCD), a light-emitting diode display, or a flat panel display.

The electrical device 3100 may include an audio output device 3108 (or corresponding interface circuitry, as discussed above). The audio output device 3108 may include any device that generates an audible indicator, such as speakers, headsets, or earbuds.

The electrical device 3100 may include an audio input device 3124 (or corresponding interface circuitry, as discussed above). The audio input device 3124 may include any device that generates a signal representative of a sound, such as microphones, microphone arrays, or digital instruments (e.g., instruments having a musical instrument digital interface (MIDI) output).

The electrical device 3100 may include GPS circuitry 3118. The GPS circuitry 3118 may be in communication with a satellite-based system and may receive a location of the electrical device 3100, as known in the art.

The electrical device 3100 may include any other output device 3110 (or corresponding interface circuitry, as discussed above). Examples of the other output device 3110 may include an audio codec, a video codec, a printer, a wired or wireless transmitter for providing information to other devices, or an additional storage device.

The electrical device 3100 may include any other input device 3120 (or corresponding interface circuitry, as discussed above). Examples of the other input device 3120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 3100 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 3100 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that employ the use of organic conjugated polymers to fabricate optical components (e.g., photodetectors, filters, etc.) directly on (e.g., integral with) a glass substrate without the cost and expense of using silicon and/or germanium-based materials and associated processing.

Further examples and combinations thereof include the following:

Example 1 includes an integrated circuit (IC) package, comprising a glass substrate, a first electrode, an organic material, the first electrode between the glass substrate and the organic material, the organic material including at least one of a conjugated polymer or a metal-organic supramolecule, and a second electrode, the organic material between the first electrode and the second electrode.

Example 2 includes the IC package of example 1, wherein the first electrode is adjacent the glass substrate, the organic material is adjacent the first electrode, and the second electrode is adjacent the organic material.

Example 3 includes the IC package of example 1, wherein the glass substrate defines a waveguide to direct light toward the organic material.

Example 4 includes the IC package of example 1, wherein the conjugated polymer includes double carbon bonds.

Example 5 includes the IC package of example 1, wherein the conjugated polymer is a thiadiazoloquinoxaline-based polymer.

Example 6 includes the IC package of example 1, wherein the organic material has a photoactive property.

Example 7 includes the IC package of example 1, wherein the organic material has an electrochromic property.

Example 8 includes the IC package of example 1, further including a build-up region, the first electrode, the organic material, and the second electrode embedded in the build-up region.

Example 9 includes the IC package of example 8, wherein the build-up region includes a first side adjacent the glass substrate and a second side opposite the first side, the second electrode closer to the glass substrate than the second side of the build-up region is to the glass substrate.

Example 10 includes the IC package of example 8, further including a semiconductor die, the semiconductor die electrically coupled to at least one of the first electrode or the second electrode.

Example 11 includes the IC package of example 8, wherein the first electrode, the organic material, and the second electrode are to collectively implement a photodetector responsive to light passing through the glass substrate.

Example 12 includes the IC package of example 1, further including a photonic integrated circuit, the second electrode between the organic material and the photonic integrated circuit.

Example 13 includes the IC package of example 12, further including an index matching epoxy between the second electrode and the photonic integrated circuit.

Example 14 includes the IC package of example 12, wherein the glass substrate includes a cavity, the first electrode, the organic material, the second electrode, and the photonic integrated circuit is within the cavity of the glass substrate.

Example 15 includes the IC package of example 12, wherein the first electrode, the organic material, and the second electrode are to collectively implement an optical filter to selectively pass light from the glass substrate to the photonic integrated circuit, a transmittance of the organic material to change based on a change in a voltage applied via the first and second electrodes.

Example 16 includes an integrated circuit (IC) package, comprising a package substrate, the package substrate including a glass core, the glass core including a first surface, and an optical component including an organic material between first and second electrodes, the glass core to transmit light to irradiate at least a portion of the organic material.

Example 17 includes the IC package of example 16, wherein the package substrate includes a build-up region, the build-up region to at least partially surround the optical component.

Example 18 includes the IC package of example 17, wherein the build-up region has a first thickness, and the optical component has a second thickness, the first thickness greater than the second thickness.

Example 19 includes the IC package of example 16, wherein the glass core includes a second surface and a third surface, the third surface recessed relative to the second surface, the first surface between the second and third surfaces.

Example 20 includes the IC package of example 19, further including a photonic integrated circuit, the optical component between the first surface and the photonic integrated circuit.

Example 21 includes a method of manufacturing an integrated circuit (IC) package, the method comprising shaping a glass substrate, depositing a first metal layer for a first electrode of an optical component over a surface of the glass substrate, depositing an organic material over the first metal layer, and depositing a second metal layer for a second electrode over the organic material, the organic material including at least one of a conjugated polymer or a metal-organic supramolecule.

Example 22 includes the method of example 21, further including removing at least a portion of at least one of the first metal layer, the organic material, or the second metal layer, at least one remaining portion of the at least one of the first metal layer, the organic material, or the second metal layer to define a portion of the optical component.

Example 23 includes the method of example 21, wherein the depositing of the organic material includes at list one of spray coating, spin coating or casting.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package, comprising:

a glass substrate;

a first electrode;

an organic material, the first electrode between the glass substrate and the organic material, the organic material including at least one of a conjugated polymer or a metal-organic supramolecule;

a second electrode, the organic material between the first electrode and the second electrode;

a build-up region, the first electrode, the organic material, and the second electrode embedded in the build-up region; and a semiconductor die electrically coupled to at least one of the first electrode or the second electrode.

2. The IC package of claim 1, wherein the first electrode is adjacent to the glass substrate, the organic material is adjacent to the first electrode, and the second electrode is adjacent to the organic material.

3. The IC package of claim 1, wherein the glass substrate defines a waveguide to direct light toward the organic material.

4. The IC package of claim 1, wherein the conjugated polymer includes double carbon bonds.

5. The IC package of claim 1, wherein the conjugated polymer is a thiadiazoloquinoxaline-based polymer.

6. The IC package of claim 1, wherein the organic material has a photoactive property.

7. The IC package of claim 1, wherein the organic material has an electrochromic property.

8. The IC package of claim 1, wherein the build-up region includes a first side adjacent to the glass substrate and a second side opposite to the first side, the second electrode closer to the glass substrate than the second side of the build-up region is to the glass substrate.

9. The IC package of claim 1, wherein the first electrode, the organic material, and the second electrode are to collectively implement a photodetector responsive to light passing through the glass substrate.

10. A method of manufacturing the IC package of claim 1, the method comprising:

shaping the glass substrate;

depositing a first metal layer for the first electrode of an optical component over a surface of the glass substrate;

depositing the organic material over the first metal layer; and depositing a second metal layer for the second electrode over the organic material.

11. The method of claim 10, including removing at least a portion of at least one of the first metal layer, the organic material, or the second metal layer, at least one remaining portion of the at least one of the first metal layer, the organic material, or the second metal layer to define a portion of the optical component.

12. The method of claim 10, wherein the depositing of the organic material includes at least one of spray coating, spin coating or casting.

13. An integrated circuit (IC) package comprising:

a glass substrate;

a first electrode;

an organic material, the first electrode between the glass substrate and the organic material, the organic material including at least one of a conjugated polymer or a metal-organic supramolecule;

a second electrode, the organic material between the first electrode and the second electrode; and a photonic integrated circuit, the second electrode between the organic material and the photonic integrated circuit.

14. The IC package of claim 13, including an index matching epoxy between the second electrode and the photonic integrated circuit.

15. The IC package of claim 13, wherein the glass substrate includes a cavity, the first electrode, the organic material, the second electrode, and the photonic integrated circuit are within the cavity of the glass substrate.

16. The IC package of claim 13, wherein the first electrode, the organic material, and the second electrode are to collectively implement an optical filter to selectively pass light from the glass substrate to the photonic integrated circuit, a transmittance of the organic material to change based on a change in a voltage applied via the first and second electrodes.

* * * * *